US012356581B2

(12) United States Patent
Lin et al.

(10) Patent No.: US 12,356,581 B2
(45) Date of Patent: Jul. 8, 2025

(54) SYSTEM AND METHOD FOR A UNIVERSAL FAN HOLDER FOR A COOLING FAN FOR INFORMATION HANDLING SYSTEMS

(71) Applicant: Dell Products, LP, Round Rock, TX (US)

(72) Inventors: Chung-An Lin, New Taipei (TW); Yu-Ming Kuo, New Taipei (TW); Chih-Yung Yang, Taipei (TW)

(73) Assignee: DELL PRODUCTS LP, Round Rock, TX (US)

( * ) Notice: Subject to any disclaimer, the term of this patent is extended or adjusted under 35 U.S.C. 154(b) by 226 days.

(21) Appl. No.: 17/950,591

(22) Filed: Sep. 22, 2022

(65) Prior Publication Data

US 2024/0107702 A1    Mar. 28, 2024

(51) Int. Cl.
*H05K 7/20* (2006.01)
*F04D 29/42* (2006.01)
*G06F 1/20* (2006.01)

(52) U.S. Cl.
CPC ..... *H05K 7/20172* (2013.01); *F04D 29/4226* (2013.01); *G06F 1/20* (2013.01); *H05K 7/20718* (2013.01)

(58) Field of Classification Search
CPC .......... H05K 7/20127; H05K 7/20136; H05K 7/20172; H05K 7/20145; H05K 7/20554; H05K 7/20718; H05K 7/20736; G06F 1/20; F04D 29/646; F04D 29/4226
USPC ....................................................... 361/724
See application file for complete search history.

(56) References Cited

U.S. PATENT DOCUMENTS 3,019,718 A * 2/1962 Earle .................. F24F 1/04
454/203
5,136,465 A   8/1992 Benck
5,472,082 A * 12/1995 Thiele ............. A45C 7/0031
190/22

(Continued)

FOREIGN PATENT DOCUMENTS

CN    201440235 U * 4/2010
CN    103034305 A * 4/2013 ........... G06F 1/20

(Continued)

*Primary Examiner* — Adrian S Wilson
*Assistant Examiner* — Gage Crum
(74) *Attorney, Agent, or Firm* — Prol Intellectual Property Law, PLLC; H. Kenneth Prol

(57) ABSTRACT

An information handling system having a reconfigurable cooling fan holder including a plurality of cooling fans of a cooling system operatively coupled to the reconfigurable cooling fan holder, a reconfigurable frame having a plurality of slidingly adjustable walls including a pair of lengthwise slidingly adjustable walls and a widthwise slidingly adjustable wall where the pair of lengthwise slidingly adjustable walls may be expanded or reduced in length by sliding the at least two slide bars nested adjacent to one another forming each lengthwise slidingly adjustable wall to extend or contract each lengthwise slidingly adjustable wall, and the widthwise slidingly adjustable wall may be expanded or reduced in width by sliding the at least two slide bars nested adjacent to one another forming the widthwise slidingly adjustable wall to extend or contract the widthwise slidingly adjustable wall for adjusting the width and length of the reconfigurable cooling fan holder.

20 Claims, 11 Drawing Sheets

(56) References Cited

U.S. PATENT DOCUMENTS

| | | | |
|---|---|---|---|
| 6,002,586 A * | 12/1999 | Chen | G06F 1/20 |
| | | | 361/717 |
| 6,970,353 B2 | 11/2005 | Brovald | |
| 7,134,203 B2 | 11/2006 | Hutchinson | |
| 7,255,529 B2 * | 8/2007 | Ku | H05K 7/20172 |
| | | | 415/214.1 |
| 7,312,989 B2 | 12/2007 | Chen | |
| 7,324,338 B1 | 1/2008 | Chi | |
| 7,447,022 B2 | 11/2008 | Murakami | |
| 7,542,289 B2 | 6/2009 | Tsai | |
| 8,210,914 B2 | 7/2012 | McMahan | |
| 8,317,463 B2 * | 11/2012 | Ye | G06F 1/20 |
| | | | 415/126 |
| 8,351,205 B2 * | 1/2013 | Tang | F04D 25/0613 |
| | | | 361/679.48 |
| 8,544,289 B2 | 10/2013 | Johnson | |
| 9,943,012 B2 | 4/2018 | Bailey | |
| 11,347,285 B2 | 5/2022 | Casparian | |
| 2005/0113016 A1 * | 5/2005 | Shen | H01L 23/467 |
| | | | 257/E23.099 |
| 2011/0021132 A1 * | 1/2011 | Chou | G06F 1/181 |
| | | | 454/184 |
| 2011/0297803 A1 * | 12/2011 | Tang | G06F 1/183 |
| | | | 248/201 |
| 2013/0306048 A1 * | 11/2013 | Georgette | F24H 9/12 |
| | | | 454/284 |
| 2021/0131450 A1 * | 5/2021 | Yang | H05K 7/14 |
| 2021/0181817 A1 * | 6/2021 | Lu | G06F 1/20 |
| 2023/0051861 A1 * | 2/2023 | Liao | G06F 1/20 |

FOREIGN PATENT DOCUMENTS

| | | | |
|---|---|---|---|
| KR | 20220170430 A | * | 12/2022 |
| TW | 201008467 A | * | 2/2010 |

* cited by examiner

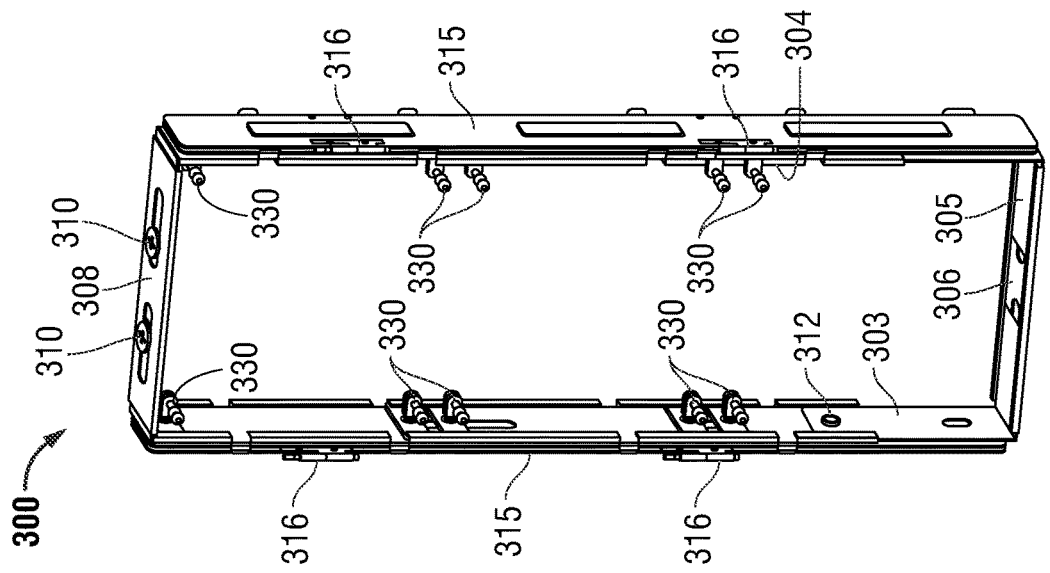
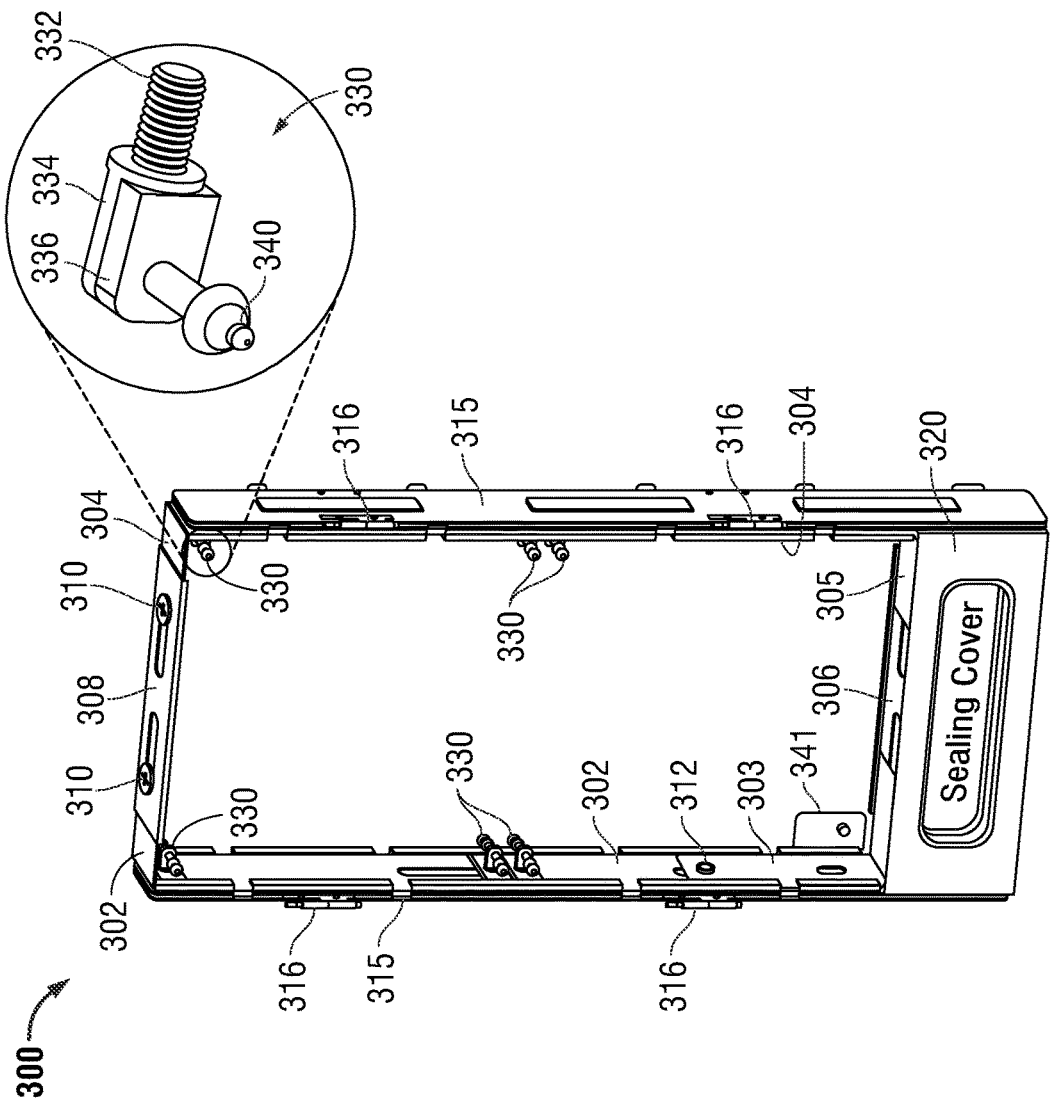
FIG. 3B
FIG. 3A

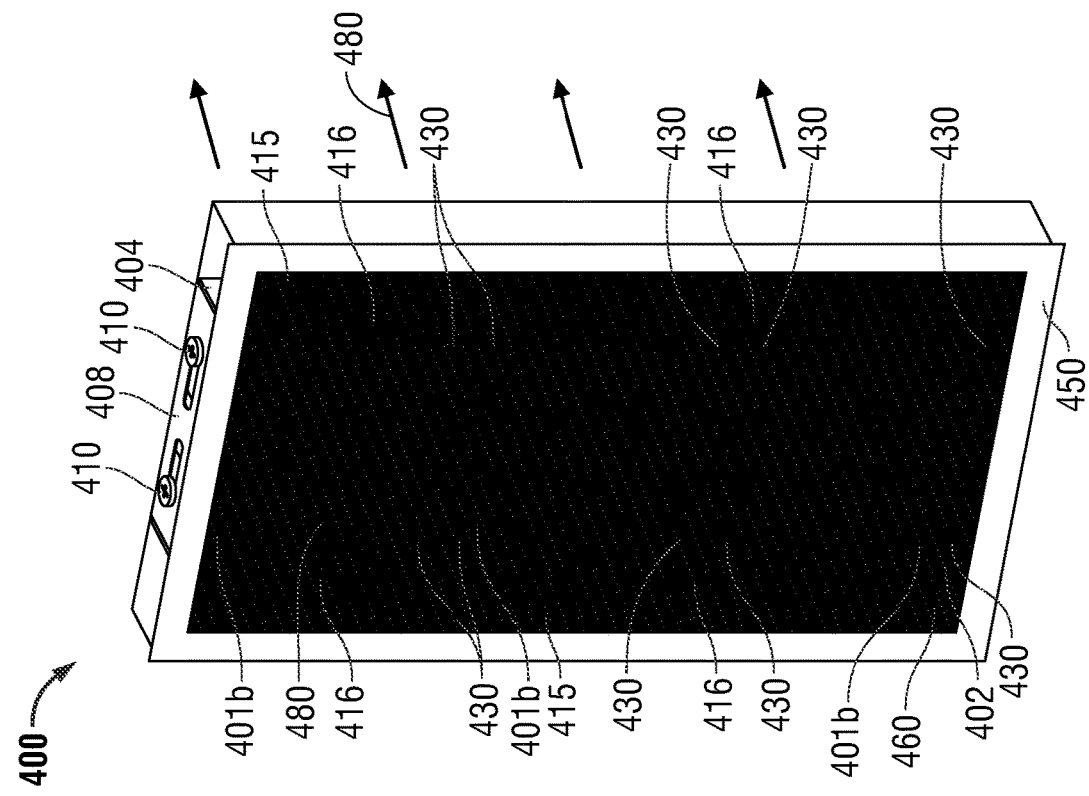
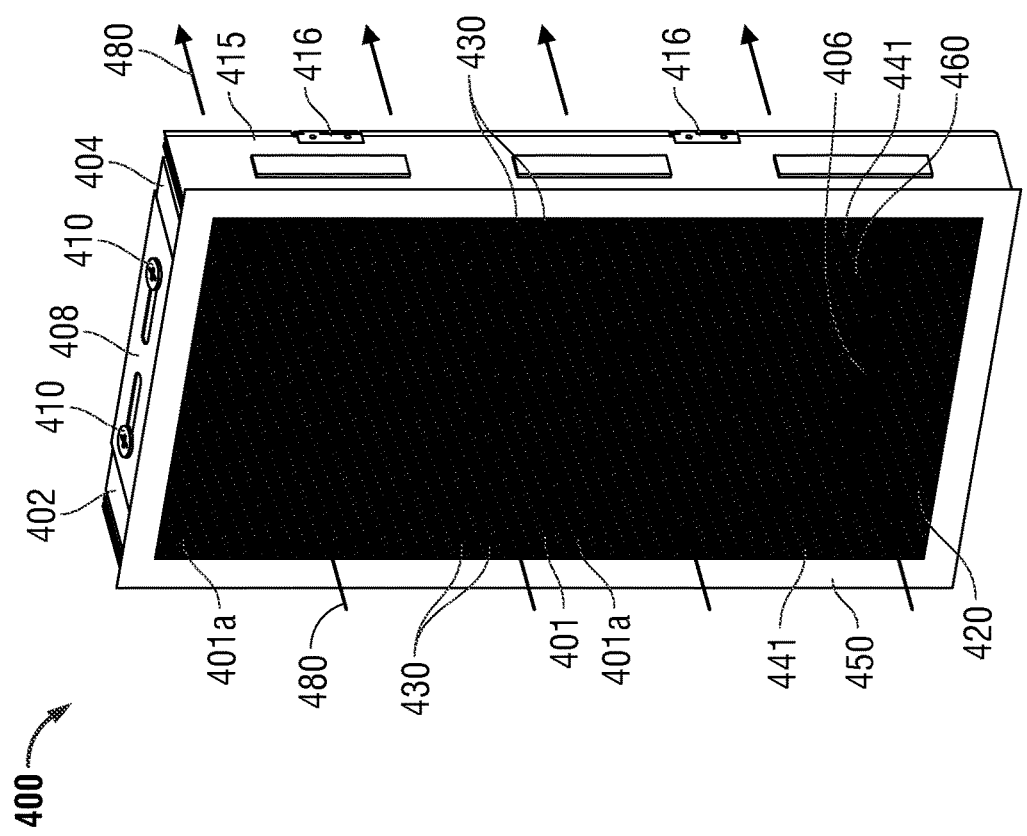
FIG. 4B
FIG. 4A

SYSTEM AND METHOD FOR A UNIVERSAL FAN HOLDER FOR A COOLING FAN FOR INFORMATION HANDLING SYSTEMS

FIELD OF THE DISCLOSURE

The present disclosure generally relates to a cooling system of an information handling system. The present disclosure more specifically relates to a system and method for a reconfigurable fan holder for one or more cooling fans to cool an information handling system.

BACKGROUND

As the value and use of information continues to increase, individuals and businesses seek additional ways to process and store information. One option available to clients is information handling systems. An information handling system generally processes, compiles, stores, and/or communicates information or data for business, personal, or other purposes thereby allowing clients to take advantage of the value of the information. Because technology and information handling may vary between different clients or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific client or specific use, such as e-commerce, financial transaction processing, airline reservations, enterprise data storage, or global communications. In addition, information handling systems may include a variety of hardware and software components that may be configured to process, store, and communicate information and may include one or more computer systems, data storage systems, and networking systems. The information handling system may include telecommunication, network communication, and video communication capabilities. Further, the information handling system may be used for high-level computing operations requiring high processing, graphics or wireless or wired data communications that may generate heat such as with execution of gaming software applications or virtual gaming interfaces or other functions. As a result, cooling systems can be integral to performance of an information handling system.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which:

FIG. 3A is a graphic diagram of a reconfigurable cooling fan holder in a first configuration according to an embodiment of the present disclosure;

FIG. 3B is a graphic diagram of a reconfigurable cooling fan holder in a second configuration according to an embodiment of the present disclosure;

FIG. 4A is a graphic diagram of a reconfigurable cooling fan holder in a first configuration in a fan aperture for an information handling system according to an embodiment of the present disclosure;

FIG. 4B is a graphic diagram of a reconfigurable cooling fan holder in a second configuration in a fan aperture for an information handling system according to an embodiment of the present disclosure;

The use of the same reference symbols in different drawings may indicate similar or identical items.

DETAILED DESCRIPTION OF THE DRAWINGS

Figure 1:
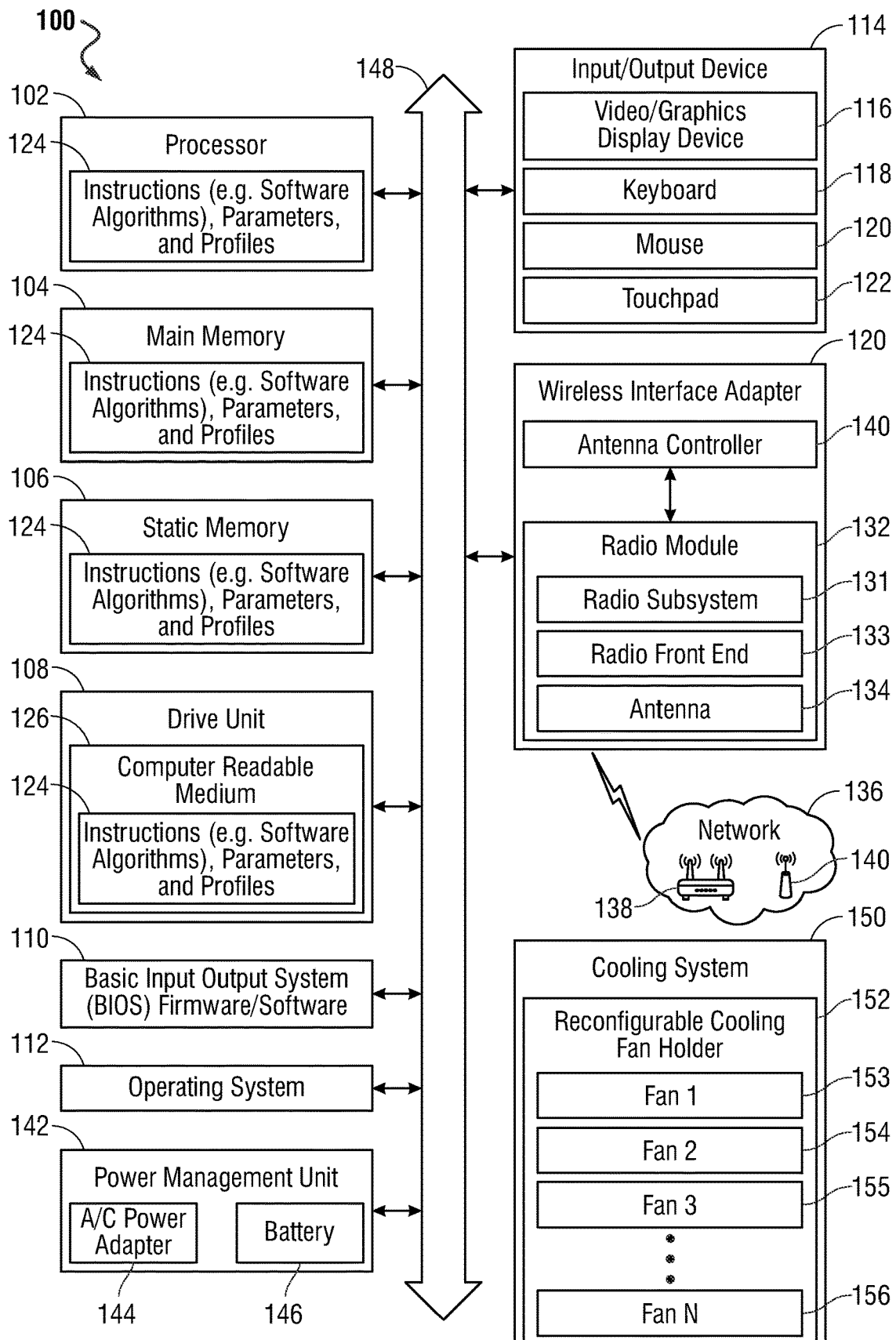
FIG. 1 is a block diagram illustrating an information handling system having a reconfigurable cooling fan holder for a cooling system according to an embodiment of the present disclosure.

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Information handling systems may include hardware processors such as central processing units, graphics processing units, or other hardware processing resources as well as wireless network devices, power systems, batteries, and other information handling system components that may generate heat when operating. In certain circumstances, when operating at a very high level heat levels may build up quickly and thermal mitigation measures may occur to avoid degraded function or even malfunction. For example, these information handling systems may be used for gaming systems or other software applications with operations that require high levels of processing and power consumption generating heat. Thermal mitigation may occur via active cooling systems such as cooling fans or liquid cooling systems, or passive cooling systems like heat sinks such as heat pipes, cold plates, vapor chambers, thermal fins, or the like.

In some embodiments, it may be desirable for manufacturer to provide active cooling system options or for a user to reconfigure or otherwise tweak an information handling system to accommodate additional gaming capabilities such as upgrading of hardware components or for aesthetic reasons. This customization is particularly common in information handling systems used for high-level gaming, such as Alienware® gaming systems. Customers often desire systems and structures of the information handling system to make customization and reconfiguration of information handling systems convenient or inexpensive.

To upgrade or otherwise customize active cooling systems, selecting or replacing cooling fans in previous systems further required replacement of a fan bracket holder which could be costly, time consuming to acquire, and difficult to replace. Further, replacement of cooling fans and brackets could involve a generic mounting on an information handling system chassis that could result in gaps or other fit issues to cause recirculation of air or other fit issues to degrade cooling efficiency of replacement cooling fan systems.

Embodiments of the present disclosure describe a new information handling system chassis with a high upgradability feature to support user's interest in do-it-yourself upgrades. Such do-it-yourself upgrading is common, for example, with gaming information handling systems. In particular, the present disclosure relates to a reconfigurable cooling fan holder that supports installation of fans of varying sizes for customizable active cooling systems without loss of cooling efficiency of those fans or fan arrays installed during customization. The present disclosure provides for embodiments of a customizable fan holder bracket for installation within an information handling system chassis to reduce cost and ease of customization for installers to provide options or for users who choose to reconfigure active cooling systems to improve performance of their information handling system.

The reconfigurable cooling fan holder of embodiments of the present disclosure include an adjustable fan holder with air sealing to prevent recirculation for installation with various fan sizes. In embodiments herein, the reconfigurable cooling fan holder is a rigid frame having a sliding structure in the length or width dimensions to accommodate various cooling fan sizes and various numbers of cooling fans in an array to support customizability. Plural variations of sliding structures for the rigid frame are disclosed to provide for adjustable length or width dimensions for the reconfigurable cooling fan holder in various embodiments. Further, reconfigurable cooling fan holder of embodiments of the present disclosure includes foldable, hinged sealing plates or reconfigurable cooling fan holder sealing inserts. These foldable, hinged sealing plates or reconfigurable cooling fan holder sealing inserts correspond to positions of the reconfigurable cooling fan holder within an aperture in the information handling system chassis for an intake or exhaust vent for the cooling fans depending on orientation of the fans. In another aspect, various embodiments of hinged, foldable sealing plates including multiple stage folding sealing plates are disclosed. Additionally, various cooling fan sizes may be mounted to the reconfigurable cooling fan holder of embodiments of the present disclosure via adjustable position resiliency screws which adjust for the dimensions of the various cooling fan sizes as well as provide damping of noise from the fan when mounted to the reconfigurable cooling fan holder.

Turning now to the figures, FIG. 1 illustrates an information handling system 100 similar to information handling systems according to several aspects of the present disclosure. In the embodiments described herein, an information handling system includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system 100 may be a personal computer, a mobile device (e.g., personal digital assistant (PDA) or smart phone), server (e.g., blade server or rack server), a consumer electronic device, a network server or storage device, a network router, switch, or bridge, wireless router, or other network communication device, a network connected device (cellular telephone, tablet device, etc.), IoT computing device, wearable computing device, a set-top box (STB), a mobile information handling system, a palmtop computer, a laptop computer, a desktop computer, a communications device, an access point (AP), a base station transceiver, a wireless telephone, a control system, a camera, a scanner, a printer, a personal trusted device, a web appliance, or any other suitable machine capable of executing a set of instructions (sequential or otherwise) that specify actions to be taken by that machine, and may vary in size, shape, performance, price, and functionality. In some particular example embodiments herein, the information handling system 100 may be a desktop computer or a server computing system, but it is contemplated that embodiments herein may be utilized with other information handling systems as well.

In a networked deployment, the information handling system 100 may operate in the capacity of a server or as a client computer in a server-client network environment, or as a peer computer system in a peer-to-peer (or distributed) network environment. In a particular embodiment, the information handling system 100 may be implemented using electronic devices that provide voice, video, or data communication. For example, an information handling system 100 may be any mobile or other computing device capable of executing a set of instructions (sequential or otherwise) that specify actions to be taken by that machine. Further, while a single information handling system 100 is illustrated, the term "system" shall also be taken to include any collection of systems or sub-systems that individually or jointly execute a set, or multiple sets, of instructions to perform one or more computer functions.

The information handling system 100 may include memory 104, 106, or 108 (volatile (e.g., random-access memory, etc.), nonvolatile (read-only memory, flash memory etc.) or any combination thereof), one or more hardware processing resources 102, such as a central processing unit (CPU), a graphics processing unit (GPU), hardware control logic, or any combination thereof. Additional components of the information handling system 100 may include one or more memory storage devices 106 or 108, one or more communications ports for communicating with external devices, as well as various input and output (I/O) devices 114, such as a keyboard 118, the touchpad 122, a mouse 120, a headset, a stylus, a video/graphics display device 116, or any combination thereof. Portions of an information handling system 100 may themselves be considered information handling systems 100.

Information handling system 100 may include devices or modules that embody one or more of the devices or execute instructions for the one or more systems and modules described herein, and operates to perform one or more of the methods. The information handling system 100 may execute instructions (e.g., software algorithms), parameters, and profiles 124 that may operate on servers or systems, remote data centers, or on-box in individual client information handling systems according to various embodiments herein. In some embodiments, it is understood any or all portions of instructions (e.g., software algorithms), parameters, and profiles 124 may operate on a plurality of information handling systems 100.

The information handling system 100 may include hardware processing resources such as a hardware processor 102 which may include a central processing unit (CPU), accelerated processing unit (APU), a neural processing unit (NPU), a vision processing unit (VPU), an embedded controller (EC), a digital signal processor (DSP), a graphics processing unit (GPU), a microcontroller, or any other type of processing device that executes code instructions to perform the processes or execute software or firmware machine readable code instructions as described herein. Any of the hardware processing resources may operate to execute code that is either firmware or software code. Moreover, the information handling system 100 may include memory such as main memory 104, static memory 106, or other memory of computer readable medium 126 storing instructions (e.g., software algorithms), parameters, and profiles 124 executable by hardware processing resources (e.g., hardware processor 102), and disk drive unit 108 (volatile (e.g., random-access memory, etc.), nonvolatile memory (read-only memory, flash memory etc.) or any combination thereof. The information handling system 100 may also include one or more buses 148 operable to transmit communications between the various hardware components such as any combination of various I/O devices 114 as well as between any hardware processors 102 code instructions of the operating system (OS) 112, the basic input/output system (BIOS) 110. Bus 148 may also provide data communications with the network interface adapter 128 including the antenna controller 130, the radio module 132, the radio subsystem 131, radio front end 133 and antenna 134 in some embodiments with wireless networking capacity. Bus 148 may also provide data communications with the power management unit (PMU) 142, among other components described herein.

The information handling system 100 may further include a video/graphics display device 116. The video/graphics display device 116 in an embodiment may function as a liquid crystal display (LCD), an organic light emitting diode (OLED), a flat panel display, or a solid-state display. Additionally, the information handling system 100 may include an I/O device 114 that allows the user to interface with the information handling system 100 via the video/graphics display device 116, such as a cursor control device (e.g., the mouse 120, touchpad 122, or gesture or touch screen input), and the keyboard 118 or stylus, among others. Various drivers and control electronics may be operatively coupled to operate the I/O device 114 according to the embodiments described herein.

The network interface device in FIG. 1 is shown as network interface adapter 128 which may be wireless, but may also be a wired network interface device as is understood in the art and may provide connectivity to a network 136 in various embodiments. Network 136 may be a wide area network (WAN), a local area network (LAN), wireless local area network (WLAN), a wireless personal area network (WPAN), a wireless wide area network (WWAN), or other network. The network interface device shown as network interface adapter 128 may also provide wireless connectivity to a network 136 via operation of a radio module 132 with control by an antenna controller 130. In an embodiment, the radio module 132 may be operatively coupled to the antenna controller 130 and may be part of wireless interface device 128 but may form a different physical device in some embodiments. In FIG. 1, radio module 132 is part of a wireless interface adapter 128, but is shown adjacent to or within a fan housing 154 according to embodiments herein. It is appreciated that any number of radios 131 and RF front ends 133 may be associated with the radio module 132 and may also be associated with a plurality of antennas 134 within the information handling system 100 and may operate under any wireless protocol according to embodiments herein.

Network interface adapter 128 may connect to network 136 via any wired network protocol such as ethernet or other wired network protocols. Network interface adapter 128 may operatively couple to a wireless network 136 that may include any combination of macro-cellular or wireless local area networking. For example, wireless connections including 2G, 2.5G, 3G, 4G, 5G or the like from one or more service providers or privately administered network providers are contemplated. The wireless interface adapter 128 may also connect to any WLAN networks such as Wi-Fi networks. Utilization of radiofrequency communication bands according to several example embodiments of the present disclosure may include bands used with the WLAN standards and WWAN carriers, which may operate in both licensed and unlicensed spectrums.

In some embodiments, software, firmware, dedicated hardware implementations such as application specific integrated circuits, programmable logic arrays and other hardware devices may be constructed to implement one or more of some systems and methods described herein. Applications that may include the apparatus and systems of various embodiments may broadly include a variety of electronic and computer systems. One or more embodiments described herein may implement functions using two or more specific interconnected hardware modules or devices with related control and data signals that may be communicated between and through the modules, or as portions of an application-specific integrated circuit. Accordingly, the present system encompasses software, firmware, and hardware implementations.

In accordance with various embodiments of the present disclosure, the methods described herein may be implemented by firmware or software programs executable by a controller or a processor system. Further, in an exemplary, non-limited embodiment, implementations may include distributed processing, component/object distributed processing, and parallel processing. Alternatively, virtual computer system processing may be constructed to implement one or more of the methods or functionalities as described herein.

The present disclosure contemplates a computer-readable medium that includes instructions, parameters, and profiles 124 or receives and executes instructions, parameters, and profiles 124 responsive to a propagated signal, so that a device connected to a network 136 may communicate voice, video, or data over the network 136. Further, the instructions 124 may be transmitted or received over the network 136 via the network interface device or wireless interface adapter 128.

The information handling system 100 may include a set of instructions 124 that may be executed to cause the computer system to perform any one or more of the methods or computer-based functions disclosed herein. For example, instructions 124 may be executed by hardware processor 102 that may be any hardware processing resource according to embodiments herein. Various software modules comprising application instructions 124 may be coordinated by an operating system (OS) 112, and/or via an application programming interface (API). An example OS 112 may include Windows®, Android®, and other OS types. Example APIs may include Win 32, Core Java API, or Android APIs. Additionally, execution of the instructions described herein may be via execution of firmware by any hardware processing resource. In an example embodiment, a software module may include gaming software applications.

The disk drive unit 108 may include a computer-readable medium 126 in which one or more sets of machine executable code instructions 124 such as software may be embedded and executed by the hardware processor 102 including any hardware processing resources as described herein in an embodiment. Similarly, main memory 104 and static memory 106 may also contain a computer-readable medium for storage of one or more sets of code instructions, parameters, or profiles 124. The disk drive unit 108 and static memory 106 may also contain space for data storage. Further, the code instructions 124 may embody one or more of the methods or logic as described herein. In a particular embodiment, the instructions, parameters, and profiles 124 may reside completely, or at least partially, within the main memory 104, the static memory 106, and/or within the disk drive 108 during execution by the hardware processor 102 of information handling system 100. As explained, some or all of the instructions 124 to be executed by a processor 102 for software applications may be executed locally, remotely or a combination thereof. The main memory 104 and the processor 102 also may include computer-readable media.

Main memory 104 may contain computer-readable medium (not shown), such as RAM in an example embodiment. An example of main memory 104 includes random access memory (RAM) such as static RAM (SRAM), dynamic RAM (DRAM), non-volatile RAM (NV-RAM), or the like, read only memory (ROM), another type of memory, or a combination thereof. Static memory 106 may contain computer-readable medium (not shown), such as NOR or NAND flash memory in some example embodiments. The computer executable instructions 124 to be executed by the antenna controller 130, processor 102, or embedded controller may be stored in static memory 106, or the disk drive unit 108 on a computer-readable medium 126 such as a flash memory or magnetic disk in an example embodiment. While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium may include a solid-state memory such as a memory card or other package that houses one or more non-volatile read-only memories. Further, the computer-readable medium may be a random-access memory or other volatile re-writable memory. Additionally, the computer-readable medium may include a magneto-optical or optical medium, such as a disk or other storage device to store information received via carrier wave signals such as a signal communicated over a transmission medium. Furthermore, a computer readable medium may store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

In other embodiments, dedicated hardware implementations such as application specific integrated circuits, programmable logic arrays and other hardware devices may be constructed to implement one or more of the methods described herein. Applications that may include the apparatus and systems of various embodiments may broadly include a variety of electronic and computer systems. One or more embodiments described herein may implement functions using two or more specific interconnected hardware modules or devices with related control and data signals that may be communicated between and through the modules, or as portions of an application-specific integrated circuit. Accordingly, the present system encompasses software, firmware, and hardware implementations.

When referred to as a "system", a "device," a "module," a "controller," or the like, the embodiments described herein may be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device). The system, device, controller, or module may include hardware processing resources executing machine readable code instructions of software or machine readable code instructions of firmware embedded at a device, such as an Intel® Core class processor, ARM® brand processors, Qualcomm® Snapdragon processors, or other processors and chipsets, or other such device, or software capable of operating a relevant environment of the information handling system. The system, device, controller, or module may also include a combination of the foregoing examples of hardware embedded with firmware or hardware executing code instructions of software. In an embodiment an information handling system 100 may include an integrated circuit or a board-level product having portions thereof that may also be any combination of hardware that may execute code instructions of software or firmware. Devices, modules, resources, controllers, or programs that are in communication with one another need not be in continuous communication with each other, unless expressly specified otherwise. In addition, devices, modules, resources, controllers, or programs that are in communication with one another may communicate directly or indirectly through one or more intermediaries.

As described herein, the information handling system 100 may further include a power management unit (PMU) 142 (a.k.a. a power supply unit (PSU)). The PMU 142 may manage the power provided to the components of the information handling system 100 such as the hardware processor 102 (e.g., a CPU, GPU, or other hardware processing resource), active components of a cooling system such as a fan, one or more disk drive units 108, a video/graphic display device 116 or other I/O device 114 such as the stylus, and other components that may require power when a power button has been actuated by a user. In an embodiment, the PMU 142 may monitor power levels and be electrically coupled to the information handling system 100 to provide this power and coupled to bus 148 to provide or receive data or instructions. The PMU 142 may regulate power from a power source such as a battery 146 or A/C power adapter 144. In an embodiment, the battery 146 may be charged via the A/C power adapter 144 and provide power to the components of the information handling system 100 via wired connections as applicable, or when A/C power from the A/C power adapter 144 is removed.

As described herein, the information handling system 100 includes a cooling system 150. The cooling system 150 may include active cooling systems such as cooling fans 153, 154, 155, 156 that may be used to cool devices housed within a chassis of the information handling system 100. The cooling system 150 may also include passive cooling system components such as heat sinks, vapor chambers, heat pipes, conductive fins, or the like. One or more cooling fans 153, 154, 155, 156, in an example embodiment, may be operatively or thermally coupled to a heat pipe or other passive cooling device that draws heat away from the hardware processor 102 power adapter 144, battery 146, radio module 132, or other heat generating component via conductive cooling. Via convective cooling by the one or more cooling fans 153, 154, 155, 156, airflow cools the heat pipe by passing air over the heat pipe and expel that now-heated air out of the chassis of the information handling system 100 such as via a vent formed on a wall of that chassis. Airflow of one or more cooling fans 153, 154, 155, 156 may further exhaust heated air from within the chassis of information handling system 100 and draw cool outside air into the information handling system 100. In some embodiments, the one or more cooling fans 153, 154, 155, 156 may be situated at an aperture for a vent formed on a wall of the information handling system chassis that may serve as an airflow inlet vent or an airflow exhaust vent depending on the orientation of the one or more cooling fans 153, 154, 155, 156. Either embodiment is contemplated in embodiments herein.

Any number of one or more cooling fans such as fan 1 153, fan 2 154, fan 3 155 . . . fan n 156 may be housed within a reconfigurable cooling fan housing 152 according to embodiments herein. In an embodiment, the reconfigurable cooling fan housing 152 may be slidably adjusted such that the shape of the reconfigurable cooling fan housing 152 may accommodate one or more of a first type of cooling fan having a first dimension. Adjustment to the shape, either length or width, of the reconfigurable cooling fan housing 152 may accommodate one or more of a second type of cooling fan having a second dimension. The change in dimensions of each of the cooling fans 153, 154, 155, 156 used with the reconfigurable cooling fan housing 152 by further be adjusted to cause a flow of air in an inlet vent or out the exhaust vent of the information handling system may cause air recirculation and reduction of airflow generated without one or more sealing structures to fill gaps in the inlet vent or the exhaust vent of the information handling system chassis. In an embodiment, one or more sealing plates may be used along a vertical or horizontal wall or a plurality of walls of the reconfigurable cooling fan housing 152 to allow for reconfigurability between space occupied by one or more of the first type of cooling fan versus a change to one or more of a second type of cooling fan. In an embodiment, the sealing plates may be a hinged and foldable sealing plate even a two-stage or multi-stage foldable sealing plate in embodiments herein. In other embodiments, an insertable sealing cover may be inserted into a space to fill the gaps in the inlet vent or the exhaust vent of the information handling system chassis. The foldable sealing plates or the insertable sealing cover may be made of a metal, plastic, or other material in various embodiments to block backflow of air to reduce efficiency of airflow generated by the one or more cooling fans 153, 154, 155, 156 installed with the reconfigurable cooling fan housing 152 in the inlet vent or the exhaust vent of the information handling system chassis. Additionally, one or more various cooling fan sizes may be mounted to the reconfigurable cooling fan holder 152 of embodiments of the present disclosure via adjustable position resiliency screws. The adjustable position resiliency screws and mounting hardware may be adjusted to accommodate the different dimensions of the various cooling fan sizes and mounting apertures on those cooling fan housings in an embodiment. The adjustable position resiliency screws also provide damping of noise from the fan when mounted to the reconfigurable cooling fan holder 152.

In an embodiment, the heat pipes may be operatively coupled to one or more cooling fans 153, 154, 155, 156 in the reconfigurable cooling fan housing 152 so that heat may be conducted into the heat pipe via passive conductive cooling wherein they are cooled by operation of the one or more cooling fans 153, 154, 155, 156 via convective cooling.

The present specification contemplates that any type of heat-producing device may be cooled via the one or more cooling fans 153, 154, 155, 156 situated in the reconfigurable cooling fan housing 152 of the embodiments herein. In some embodiments, any hardware processing resource such as hardware processor 102, a radio module 132, a battery 146 or A/C power adapter 144 may be arranged to be cooled by the one or more cooling fans 153, 154, 155, 156 situated in the reconfigurable cooling fan housing 152 in various embodiments. Such a cooling system 150 of the present disclosure may be easily and cost-effectively reconfigured with the reconfigurable cooling fan housing 152 of the embodiments herein.

Figure 2A:
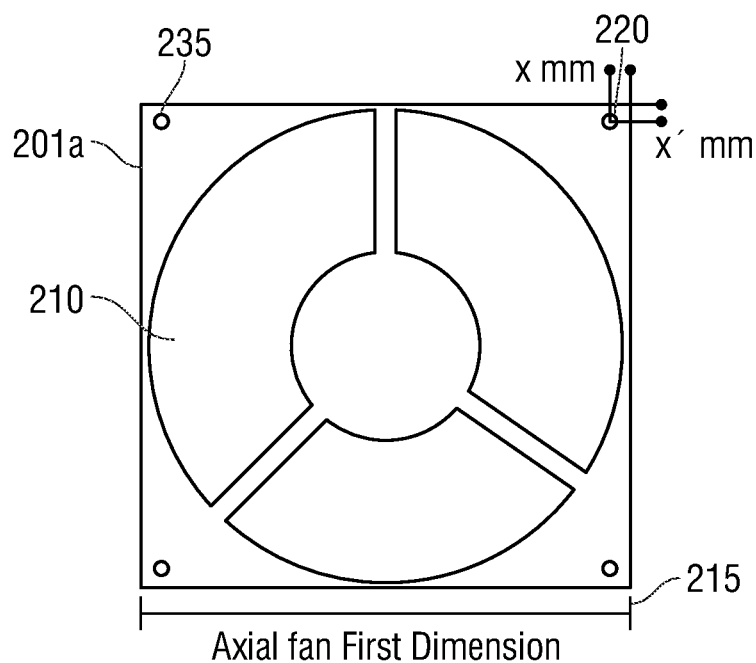
FIG. 2A is a graphic diagram of a first cooling fan of a first example dimension for use with the reconfigurable cooling fan holder according to an embodiment of the present disclosure.

FIG. 2A illustrates a graphic diagram of an example cooling fan 201a of a first type and having a first set of dimensions. The first type of cooling fan 201a is shown as having a width dimension 215 which, in the example embodiment, is also the length dimension since the first cooling fan type 201a has a square fan housing structure that houses the cooling fan impeller 210. It is contemplated that the first cooling fan type 201a may include a rectangular fan housing in some embodiments where the first cooling fan type width dimension 215 may be different from a first cooling fan type length dimension in some embodiments. The first type of cooling fan 201a may include one or more mounting apertures 235 or mounting holes. As will be seen with respect to FIG. 2B below, these mounting apertures 235 may be located at a different position relative to a corner of the fan housing structure in differing fan types. In the shown example embodiment of FIG. 2A, the mounting aperture 235 is at a first distance x from a first side wall and a second distance x' from a second side wall forming the corner of the fan housing for first type of cooling fan 201a. The example first type of cooling fan 201a having the first cooling fan type length dimension with a mounting aperture 235 at x, x' may be operatively coupled to the reconfigurable cooling fan holder with adjustable position resiliency screws in embodiments herein.

Figure 2B:
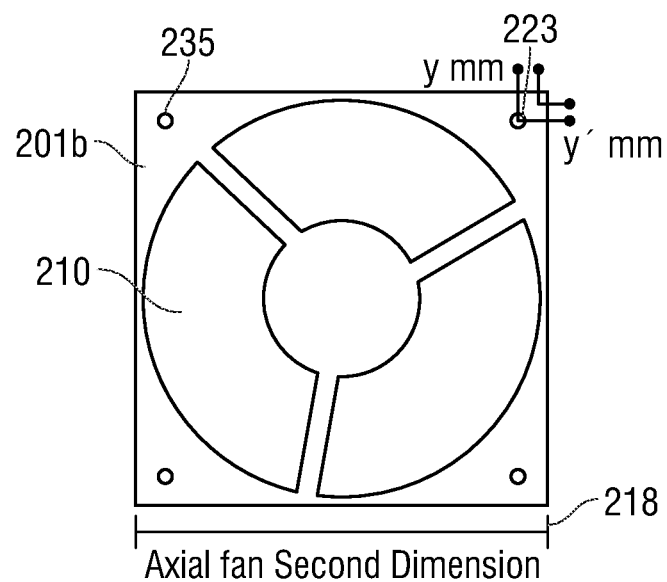
FIG. 2B is a graphic diagram of a second cooling fan of a second example dimension for use with the reconfigurable cooling fan holder according to an embodiment of the present disclosure.

FIG. 2B illustrates a graphic diagram of an example cooling fan 201b of a second type and having a second set of dimensions. The second type of cooling fan 201b is shown as having a width dimension 218 which, in the example embodiment, is also the length dimension since the second cooling fan type 201b has a housing that is also a square structure that houses the cooling fan impeller 210. It is contemplated that the second cooling fan type 201b may include a rectangular fan housing in some embodiments where the second cooling fan type width dimension 218 may be different from a second cooling fan type length dimension in some embodiments. The second type of cooling fan 201b may include one or more mounting apertures 235 or mounting holes. As will described, these mounting apertures 235 may be located at a different position relative to a corner of the fan housing structure in the differing fan types, such as between FIG. 2A and FIG. 2B. In the shown example embodiment of FIG. 2A, the mounting aperture 235 is at a first distance y from a first side wall and a second distance y' from a second side wall forming the corner of the fan housing for second type of cooling fan 201b. The example second type of cooling fan 201b having the second cooling fan type length dimension with a mounting aperture 235 at y, y' may also be operatively coupled to the reconfigurable cooling fan holder with adjustable position resiliency screws in embodiments herein.

FIG. 3A is a graphic diagram that illustrates a reconfigurable cooling fan holder 300 according to an embodiment of the present disclosure. The cooling fan holder 300 is shown in a first configuration for accommodating a first type of cooling fan having a first dimension. FIG. 3B is a graphic diagram of the reconfigurable cooling fan holder 300 in a second configuration according to an embodiment of the present disclosure. The reconfigurable cooling fan holder 300 in the second configuration is sized to accommodate an example second type of cooling fan having a second dimension that has a narrower width than the first type of cooling fan according to the shown embodiment. In the shown example embodiment, the reconfigurable cooling fan holder 300 in the second configuration of FIG. 3B that is sized to accommodate the narrower, second type of cooling fan may accommodate a bank of three cooling fans in an embodiment. The reconfigurable cooling fan holder 300 in the first configuration of FIG. 3A is sized to accommodate a wider, first type of cooling fan and may accommodate a bank of two cooling fans in an embodiment.

The reconfigurable cooling fan holder 300 in the embodiments if FIG. 3A and FIG. 3B further includes a plurality of adjustable position resiliency screws 330 adjustable to mount cooling fans of various sizes in the reconfigured frame of the reconfigurable cooling fan holder 300. As can be seen from FIG. 3A, six adjustable position resiliency screws 330 are used to mount two cooling fans of a first type having a wider, first dimension in the shown configuration of reconfigurable cooling fan holder 300. In such an embodiment, the bottom cooling fan of the first type need only be mounted using only two adjustable position resiliency screws 330 and held in place with a fan holder fin such as 341 or other holder along the bottom of the bottom cooling fan. In other embodiments, an additional two adjustable position resiliency screws (not shown) may be used to hold the bottom portion of the bottom cooling fan of the first type in the configuration of FIG. 3A.

Close-up detail of the adjustable position resiliency screw 330 is shown in FIG. 3A. The adjustable position resiliency screws 330 are adjustable to fit various mounting apertures, such as 235 in FIGS. 2A and 2B for various cooling fan sizes. The adjustable position resiliency screws 330 includes a screw post 332 and platform 334 made of a metal material or other structural material for mounting in a receiving aperture of a side wall sliding bar of the reconfigurable cooling fan holder 300. The screw post 332 may be mounted at various lengths into the side wall sliding bar to a fastener such as a nut as a first adjustment of distance from the sidewall sliding bar. The adjustable position resiliency screws 330 further comprises a damper cushion 336 and mounting post 340 made of a vibration absorbing material such as synthetic rubber or silicone to absorb vibration during operation of the cooling fans while providing structure to mount the cooling fans of various types in some embodiments.

Similarly, as shown in FIG. 3B, ten adjustable position resiliency screws 330 are used to mount three cooling fans of a second type with a narrower, second dimension in the second configuration of reconfigurable cooling fan holder 300 shown. In such an embodiment, the bottom cooling fan of the second type need only be mounted using only two adjustable position resiliency screws 330 and held in place with a fan holder fin (not shown) or other holder along the bottom of the bottom cooling fan of the second type. In other embodiments, an additional two adjustable position resiliency screws 330 may be used to hold the bottom portion of the bottom cooling fan of the second type in FIG. 3B.

The reconfigurable cooling fan holder 300 of FIGS. 3A and 3B comprises a reconfigurable frame having at least five or optionally six sliding bars 302, 303, 304, 305, 308, and optionally 306 in one embodiment. The sliding bars 302 and 303 form a first slidably adjustable length wall of the reconfigurable frame to form two, nested length wall portions that are operably coupled via set screw or other fastener 312. A slidably adjustable length wall is also referred to herein as a lengthwise slidably adjustable side wall. These length adjustable sliding bars 302 and 303 form a left-side slidably adjustable length wall of the reconfigurable frame in the shown embodiment. These length sliding bars 302 and 303 are formed to nest adjacent to one another to slide nestingly in a track or a slot to expand or reduce the length of the left-side slidably adjustable length wall that they form. Similarly, in an embodiment, sliding bars 304 and 305 form a second slidably adjustable length wall of the reconfigurable frame to form two, nested length wall portions that are operably coupled via set screw or other fastener (not shown in the perspective view). These length adjustable sliding bars 304 and 305 form a right-side slidably adjustable length wall of the reconfigurable frame for the reconfigurable cooling fan holder 300 in the shown embodiments. These length sliding bars 304 and 305 are also formed to nest adjacent to one another to slide nestingly in a slot or track to expand or reduce the length of the right-side slidably adjustable length wall that they form.

The sliding bar 302 that forms part of left-side slidably adjustable length wall and the sliding bar 304 that forms part of the right-side slidably adjustable length wall in the shown embodiment of the reconfigurable cooling fan holder 300 both include a top corner portion. The top corner portions of sliding bars 302 and 304 each have an extension that forms a portion of a top slidably adjustable length wall for the reconfigurable frame. The top slidably adjustable length wall for the reconfigurable frame includes a width sliding bar 308 having two elongated apertures to permit set screws 310 or another setting fastener to set a width of the top slidably adjustable length wall with the top corner extensions of sliding bars 302 and 304 for the reconfigurable frame in an embodiment. The top corner extensions of the sliding bars 302 and 304 slide nestingly, as if in a track or slot, of the width sliding bar 308 of the reconfigurable frame of the reconfigurable cooling fan holder 300. As shown between FIGS. 3A and 3B, the elongated apertures allow set screws 310 or other setting fasteners to be moved laterally along the width to set or affix the width sliding bar 308 in the top corner extensions of the sliding bars 302 and 304 for an adjustable width dimension of the reconfigurable cooling fan holder 300.

The sliding bar 303 that forms part of left-side slidably adjustable length wall and the sliding bar 305 that forms part of the right-side slidably adjustable length wall in the shown embodiment of the reconfigurable cooling fan holder 300 both include a bottom corner portion. The bottom corner portions of sliding bars 303 and 305 each have an extension that forms a portion or serves as all of a bottom slidably adjustable length wall for the reconfigurable frame in various embodiments. A width sliding bar 306 may not be required in some embodiments in the reconfigurable cooling fan holder 300 of FIGS. 3A and 3B to hold or maintain the bank of cooling fans of varying types upon reconfiguration for each cooling fan type.

In other embodiments, the bottom corner portions of sliding bars 303 and 303 each have the extension described and form a portion of the bottom slidably adjustable width wall for the reconfigurable frame and are slidingly nested with a width sliding bar 306. The bottom slidably adjustable width wall for the reconfigurable frame includes the width sliding bar 306 having two elongated apertures to permit set screws or another setting fastener (not visible) to set a width of the bottom slidably adjustable width wall with the bottom corner extensions of sliding bars 303 and 305 for the reconfigurable frame in another embodiment. The top corner extensions of the sliding bars 302 and 304 slide nestingly, as if in a track, of the width sliding bar 308 of the reconfigurable frame of the reconfigurable cooling fan holder 300. The elongated apertures allow set screws or other setting fasteners to be moved laterally along the width to set or affix the width sliding bar 306 in the bottom corner extensions of the sliding bars 303 and 305 for an adjustable width dimension of the reconfigurable cooling fan holder 300. A slidably adjustable width wall is also referred to herein as a widthwise slidably adjustable side wall.

Although the example embodiments of FIG. 3A and FIG. 3B shows slide bars 302 and 304 having extension portions that nest under slide bar 308, and slide bars 303 and 305 have extension portions that nest under slide bars 302 and 304 respectively as well as nest under slide bar 306 in an optional embodiment, it is contemplated that the order or orientation of the slide bars as to nesting into sliding slots or sliding tracks may be in any order or orientation according to various embodiments. For example, slide bar 308 could slidingly nest inside either or both of slide bars 303 and 304, for example in a sliding track, in some embodiments. Similarly, either or both of slide bars 302, 304, or 306 may slidingly nest inside slide bars 303 or 305 in other embodiments.

The reconfigurable cooling fan holder 300 includes a plurality of hinged, foldable sealing plates 315 and an insertable sealing cover 320 to provide for effective airflow with the cooling fans when the reconfigurable cooling fan holder 300 is size reconfigured between the embodiments of FIG. 3A and FIG. 3B to accommodate cooling fan banks having different cooling fan dimensions. The reconfigurable cooling fan holder 300 may be formed to fit into a vent aperture, whether an exhaust vent or an inlet vent depending on the orientation of the cooling fans, of an information handling system such as a desktop information handlings system or a server information handling system. Depending on the configuration selected between accommodating a bank of first type of cooling fans having a first size as in FIG. 3A or a bank of second type of cooling fans having a second size as in FIG. 3B, the number of cooling fans in the fan bank may change as well as the width of the cooling fans used which could leave gaps in the vent aperture of the information handling system. In an embodiment where a wider cooling fan is used as in the reconfigurable cooling fan holder 300 of FIG. 3A, only two cooling fans may fit with the vent aperture in a bank of first type of cooling fans. Thus, the length of the information handling system may be longer thus leaving a gap at the top or bottom of the reconfigurable cooling fan holder 300. To avoid air recirculation through this gap in the vent aperture that may reduce the effectiveness of the band of first type of cooling fans in FIG. 3A an insertable sealing cover 320 may be used below as shown, or above or between in other embodiments, the bank of two of the first type of cooling fan. In this way, the reconfigurable cooling fan holder 300 permits a user to utilize the first type of cooling fan with the information handling system vent aperture effectively.

The reconfigurable cooling fan holder 300 may also have the reconfigurable frame configured as in the embodiment of FIG. 3B for when an installer or a user chooses to modify her system to accommodate a bank of the second type of cooling fans having a second dimension. In this embodiment, the second type of cooling fan has a narrower dimension but may permit a bank of three of the second type of cooling fans used with the information handling system vent aperture. In such an embodiment, the reconfigurable frame of the reconfigurable cooling fan holder 300 may be sized to a narrower width to accommodate the second dimension of the second type of cooling fan. This may leave a gap on one or both length sides of the reconfigurable cooling fan holder 300 frame in the vent aperture of the information handling system. For this reason, the reconfigurable cooling fan holder 300 includes one or more hinged, foldable sealing plates 315 hinged to the left-side or right-side slidably adjustable length walls at hinges 316 in various embodiments. In one example embodiment of FIGS. 3A and 3B, a first foldable sealing plate 315 is hinged to sliding bar 302 at hinges 316 on the left-side slidably adjustable length wall of the reconfigurable fan holder 300. In another example embodiment of FIGS. 3A and 3B, a second foldable sealing plate 315 is hinged to sliding bar 304 at hinges 316 along the right-side slidably adjustable length wall. In the narrower configuration of FIG. 3B, the either or both foldable sealing plates 315 may be opened outward as shown in FIG. 4B below from the closed position as shown to fill one or more lengthwise gaps in the information handling system vent aperture to reduce or avoid air recirculation and reduced efficiency of the bank of the second type cooling fans used with the second configuration embodiment of FIG. 3B. The foldable sealing plates 315 may be made of any rigid material such as metal or plastic that may impede recirculated airflow around the reconfigurable fan holder 300 when in the narrower configuration of FIG. 3B when installed in an information handling system vent aperture.

FIG. 4A is a graphic diagram that illustrates a reconfigurable cooling fan holder 400 according to an embodiment of the present disclosure. The reconfigurable cooling fan holder 400 is shown in a first configuration for accommodating a first type of cooling fan 401a in a bank of two cooling fans 401a having a first dimension in a vent aperture 450 for an information handling system in an embodiment. FIG. 4B is a graphic diagram of the reconfigurable cooling fan holder 400 in a second configuration according to an embodiment of the present disclosure. The reconfigurable cooling fan holder 400 in the second configuration is sized to accommodate an example second type of cooling fan 401b having a second dimension that has a narrower width than the first type of cooling fan 401a according to the shown embodiment. In the shown example embodiment, the reconfigurable cooling fan holder 400 in the second configuration of FIG. 4B is sized to accommodate the narrower, second type of cooling fan and may thus accommodate a bank or fan stack of three cooling fans 401b in the vent aperture 450 for the information handling system in an embodiment.

The reconfigurable cooling fan holder 400 further includes a plurality of adjustable position resiliency screws 430 adjustable to mount cooling fans of various sizes in the reconfigured frame of the reconfigurable cooling fan holder 400 in configuration embodiments shown in FIG. 4A and FIG. 4B. As can be seen from FIG. 4A, six adjustable position resiliency screws 430 are used to mount two cooling fans of a first type 401a with a wider, first dimension in the shown configuration of reconfigurable cooling fan holder 400. In such an embodiment, the bottom cooling fan of the first type need only be mounted using only two adjustable position resiliency screws 430 and held in place with a fan holder fin such as 441 or other holder along the bottom of the bottom cooling fan. In other embodiments, an additional two adjustable position resiliency screws (not shown) may be used to hold the bottom portion of the bottom cooling fan of the first type 401a in the configuration of FIG. 4A.

Similarly, as shown in FIG. 4B, ten adjustable position resiliency screws 430 are used to mount three cooling fans of a second type 401b with a narrower, second dimension in the second configuration of reconfigurable cooling fan holder 400 shown. In such an embodiment, the bottom cooling fan of the second type 401b need only be mounted using only two adjustable position resiliency screws 430 and held in place with a fan holder fin (not shown) or other holder along the bottom of the bottom cooling fan of the second type. In other embodiments, an additional two adjustable position resiliency screws 430 may be used to hold the bottom portion of the bottom cooling fan of the second type in FIG. 4B. The adjustable position resiliency screws 430 are adjustable to fit various mounting apertures for various cooling fan sizes such as 401a and 401b but also comprises a damper cushion and mounting post made of a vibration absorbing material to absorb vibration during operation of the cooling fans of various types in some embodiments.

The reconfigurable cooling fan holder 400 of FIGS. 4A and 4B comprises a reconfigurable frame having at least five, or optionally six, sliding bars including those shown at 402, 404, and 408 forming portions of a top slidably adjustable width wall of the reconfigurable cooling fan holder 400 frame. As can be seen in FIGS. 4A and 4B, the sliding bars 402, 404, and 408 form the nested width wall portions that are operably coupled via set screw or other fastener 410 to set a width of the reconfigurable cooling fan holder 400. As described above for FIGS. 3A and 3B, other length adjustable sliding bars (not shown) may form the right-side and left-side slidably adjustable length walls and the bottom slidably adjustable width wall of the reconfigurable cooling fan holder 400 in the shown embodiment. With these sliding bars, the right-side and left-side slidably adjustable length walls may be expanded in length from the embodiment shown in FIG. 4A accommodating two cooling fans of a first type 401a to the embodiment of FIG. 4B accommodating three cooling fans of the second type 401b within the vent aperture 450. In an embodiment, vent aperture 450 of the information handling system may include a cover 460 that may be a cloth cover, a grate made of plastic or another material, or another cover to cover the bank of cooling fans 401a in FIG. 4A or cooling fans 401b in FIG. 4B. In the shown embodiment, an airflow 480 may be generated through the bank of fans such that the vent aperture 450 of the information handling system is an inlet vent aperture with airflow flowing into the bank of fans and into the internal portions of the information handling system.

When the length of the reconfigurable cooling fan holder 400 is shorter as in the embodiment of FIG. 4A to accommodate the bank of first type of cooling fans 401a, an insertable sealing cover 420 is used to fill the gap in the vent aperture 450 to prevent a recirculation of airflow from the gap and facilitate concentration of the airflow 480 into the bank of the first type of cooling fans 401a in FIG. 4A.

When the length of the reconfigurable cooling fan holder 400 is lengthened as in the embodiment of FIG. 4B to accommodate the bank or fan stack of the second type of cooling fans 401b that are narrower than the vent aperture 450, the reconfigurable cooling fan holder 400 includes a one or more hinged, foldable sealing plates 415 that may be extended to fill a gap in the width of the vent aperture. The one or more hinged, foldable sealing plates 415 are folded open on hinges 416 to provide for effective airflow 480 with the bank of the second type of cooling fans 401b when the reconfigurable cooling fan holder 400 is reconfigured to the dimensions shown in FIG. 4B. The one or more hinged, foldable sealing plates 415 are folded closed via hinges 416 to accommodate the first type of cooling fans 401a having a wider cooling fan dimension that fills the vent aperture 450 in the embodiment of FIG. 4A. While the airflow 480 in FIGS. 4A and 4B is shown to flow through the reconfigurable cooling fan holder 400 that is reconfigured to fit into a vent aperture 450 for an inlet airflow 480, it is contemplated that the banks of cooling fans 401a or 401b may be reversed in other embodiments such that the vent aperture 450 serves as an exhaust vent for an information handling system.

The reconfigurable cooling fan holder 400 permits a user to utilize the first type of cooling fan 401a with the information handling system vent aperture 450 effectively via utilization of an insertable sealing cover 420 to fill the gap of the bank of cooling fans 401a in the vent aperture 450 in the first configuration embodiment of FIG. 4A. The reconfigurable cooling fan holder 400 also permits a user to utilize the second type of cooling fan 401b if she wishes with the information handling system vent aperture 450 effectively instead via reconfiguration of the adjustable frame of the reconfigurable cooling fan holder 400 and extension of one or more hinged, foldable sealing plates 415 to fill the gap of the bank of cooling fans 401b in the vent aperture 450 in the second configuration embodiment of FIG. 4A.

Figure 5A:
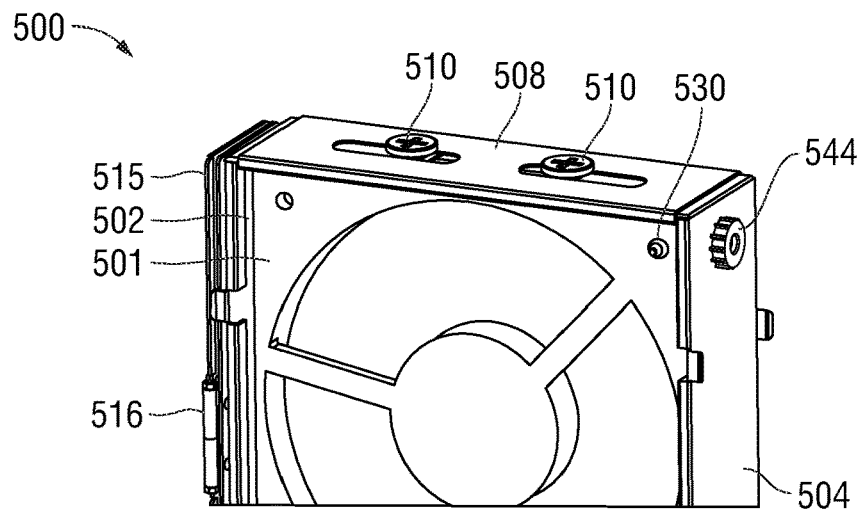
FIG. 5A is a graphic diagram close-up view of an adjustable position resiliency screw used with a reconfigurable cooling fan holder according to an embodiment of the present disclosure.

FIG. 5A illustrates a perspective view of an adjustable position resiliency screw 530 used with a reconfigurable cooling fan holder 500 and a cooling fan 501 according to an embodiment of the present disclosure. The adjustable position resiliency screw 530 is shown in the left figure with detail of the adjustable position resiliency screw 530 mounted through an aperture of the cooling fan 501 as well as fastened via fastener 544 to a sliding bar 504 of a right-side slidably adjustable wall of the reconfigurable cooling fan holder. The reconfigurable cooling fan holder 500 includes sliding bars 502 and 504 forming portions of the left-side and right side slidably adjustable walls of the reconfigurable cooling fan holder 500 in an embodiment. The sliding bars 502 and 504 are nested with sliding bar 508 to form a top slidably adjustable width wall of the reconfigurable cooling fan holder. Set screws 510 hold the sliding bar 508 with respect to the sliding bars 502 and 504 to set the width of the top slidably adjustable width wall of the reconfigurable cooling fan holder 500.

Figure 5B:
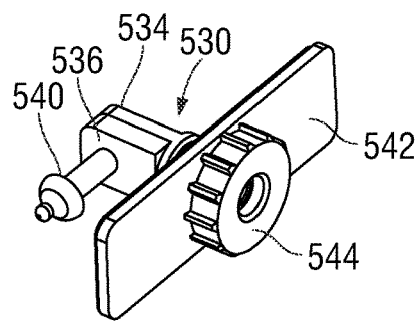
FIG. 5B is a graphic diagram close-up view of an adjustable position resiliency screw according to an embodiment of the present disclosure.

FIG. 5B illustrates a perspective view of detail of the adjustable position resiliency screw 530 including a rubber cushion 542 for mounting with a sliding bar of the reconfigurable cooling fan holder 500 according to an embodiment of the present disclosure. The adjustable position resiliency screws 530 includes a screw post (not shown) and platform 334 made of a metal material or other structural material for mounting in a receiving aperture of a side wall sliding bar of the reconfigurable cooling fan holder 500. The screw post may be mounted at various lengths into the side wall sliding bar and held at those lengths by the receiving fastener 544, such as a nut to permit adjustment of distance from the sidewall sliding bar to accommodate cooling fans having mounting apertures of differing dimensions within the fan housing. The adjustable position resiliency screws 530 further comprises a damper cushion 536 bonded to the platform 534 and mounting post 540 made of a vibration absorbing material such as synthetic rubber or silicone to absorb vibration during operation of the cooling fans while also providing structure to mount the cooling fans of various types and sizes in some embodiments.

Figure 5C:
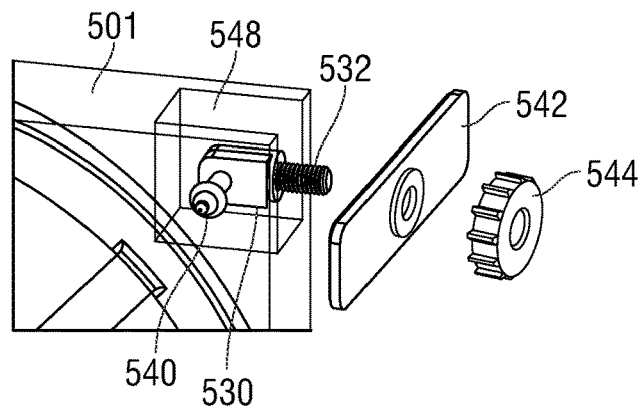
FIG. 5C is a graphic diagram close-up view of an adjustable position resiliency screw used to mount a cooling fan according to an embodiment of the present disclosure.

FIG. 5C illustrates a perspective view of detail of the adjustable position resiliency screw 530 including mounted in a mounting aperture of a cooling fan 501 according to an embodiment of the present disclosure. In the shown embodiment, a screw post 532 of the adjustable position resiliency screw 530 is shown in an exploded view with a rubber cushion 542 and nut fastener 544 for mounting with a sliding bar of the reconfigurable cooling fan holder 500. The adjustable position resiliency screw 530 shows the screw post 534 and platform with bonded damper cushion and mounting post 540 inserted into a corner mounting aperture for receiving the mounting post 540 at a corner of the housing for the cooling fan 501. The adjustable position resiliency screw 530 may fit into a slot 548 at the corner of the housing for the cooling fan 501 such that the mounting post 540 may be press fit or interference fit into the mounting aperture on the cooling fan housing in some embodiments.

Figure 5D:
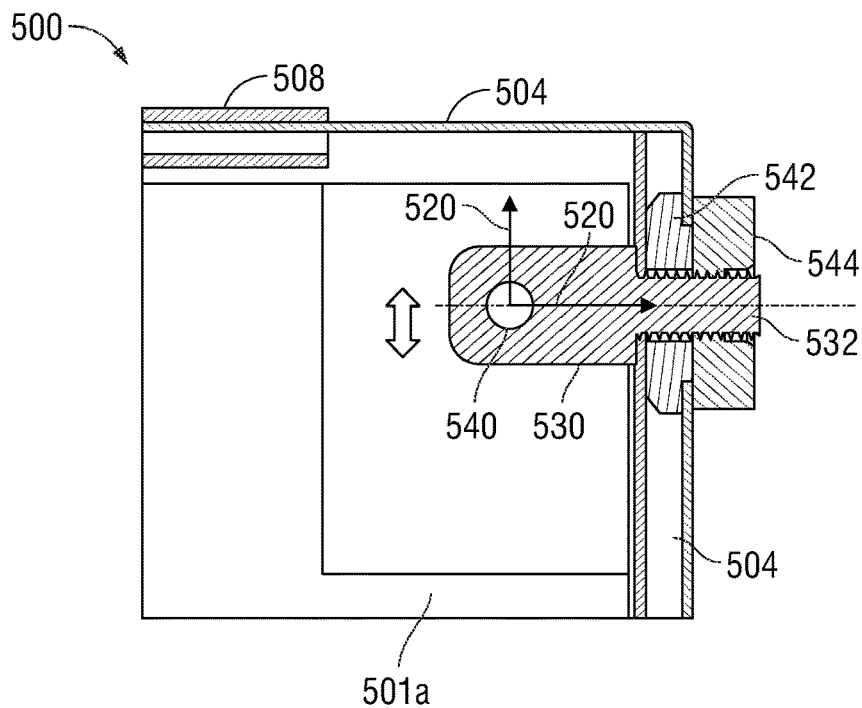
FIG. 5D is a cross section diagram close-up view of an adjustable position resiliency screw used with a reconfigurable cooling fan holder for a first type of cooling fan according to an embodiment of the present disclosure.

FIG. 5D illustrates a cross section view of an adjustable position resiliency screw 530 used with a reconfigurable cooling fan holder 500 and a first type of cooling fan 501a having a first dimension according to an embodiment of the present disclosure. FIG. 5D shows a first type of cooling fan 501a mounted in the reconfigurable cooling fan holder 500 at a top right corner and including sliding bars 504 and 508 forming the top right corner of the adjustable frame for the reconfigurable cooling fan holder 500. The adjustable position resiliency screw 530 includes a screw post 532 and a mounting post 540 for press fit or interference fit into a mounting aperture at the corner of the first type of cooling fan 501a. The mounting aperture location on the face of the cooling fan housing, and thus the location for the mounting post 540, is at a first distance 520 from the sliding bar 504 of the reconfigurable cooling fan holder 500 and edges of the cooling fan housing. The adjustable position resiliency screw 530 screw post 532 may be moved up or down within the sliding bar 504 with cushion 542 along a right sidewall to fit in an aperture of the sliding bar 504. The adjustable position resiliency screw 530 is secured via a rubber cushion 542 disposed in the sliding bar 504 and the fastener 544 such as a nut to hold the screw post 532.

Figure 5E:
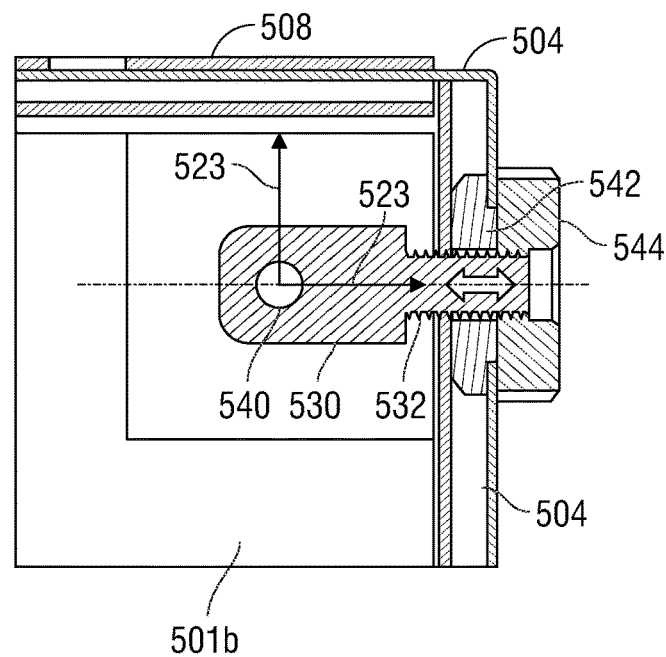
FIG. 5E is a cross section diagram close-up view of an adjustable position resiliency screw used with a reconfigurable cooling fan holder for a second type of cooling fan according to an embodiment of the present disclosure.

FIG. 5E illustrates a cross section view of an adjustable position resiliency screw 530 used with a reconfigurable cooling fan holder 500 and a second type of cooling fan 501b having a second dimension according to an embodiment of the present disclosure. FIG. 5E shows a second type of cooling fan 501b mounted in the reconfigurable cooling fan holder 500 at a top right corner where the reconfigurable cooling fan holder is configured to be narrower to accommodate a narrower dimension of the second type of cooling fan 501b. This is shown where sliding bars 504 and 508 forming the top slidably adjustable width wall have greater nesting overlap than in FIG. 5D. The upper right corner of the adjustable frame for the reconfigurable cooling fan holder 500 is shown with the adjustable position resiliency screw 530 including the screw post 532 and a mounting post 540 for press fit or interference fit into a mounting aperture at the corner of the housing for the second type of cooling fan 501b to mount it to the reconfigurable cooling fan holder 500. The mounting aperture location of this second type of cooling fan 501b, and thus the location for the mounting post 540, is at a second distance 523 from the sliding bar 504 of the reconfigurable cooling fan holder 500 and from the edges of the cooling fan housing. The adjustable position resiliency screw 530 screw post 532 may be moved up or down within the sliding bar 504 via the cushion 542 that may slidably adjust in sliding bar 504 at the aperture for the adjustable position resiliency screw 530 along a right sidewall of the sliding bar 504. The adjustable position resiliency screw 530 is secured via the rubber cushion 542 disposed in the sliding bar 504 and the fastener 544 such as a nut to hold the screw post 532. As shown, the screw post 532 of the adjustable position resiliency screw 530 is not disposed as far into the receiving fastener 544, such as a nut. Thus, the adjustable position resiliency screw 530 may be adjusted in this way for the distance 523 from the mounting aperture of the second type of cooling fan 501b to the sliding bar 504 of the reconfigurable cooling fan holder 500.

Figure 6:
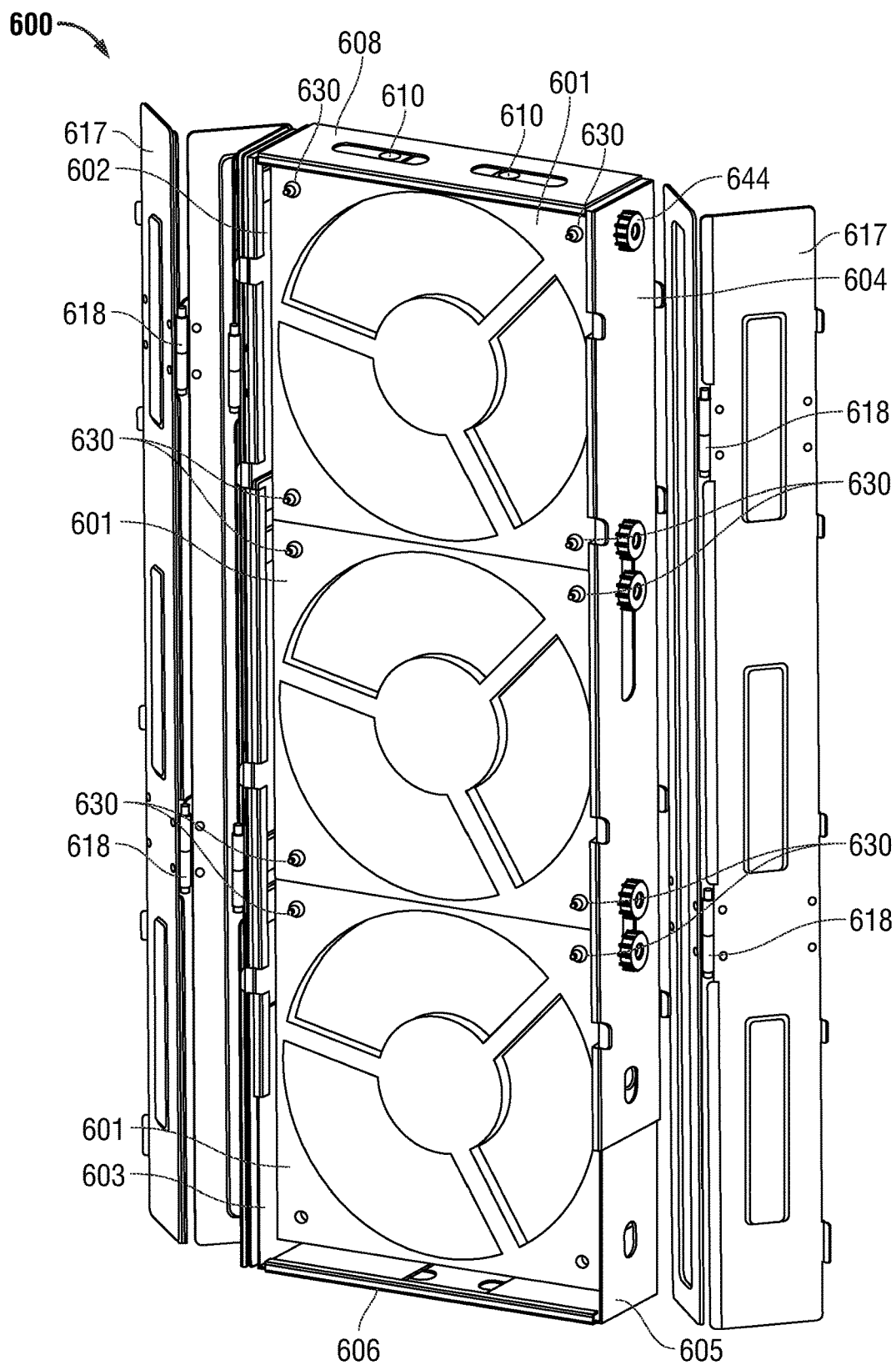
FIG. 6 is a graphic diagram perspective view of a reconfigurable cooling fan holder with a two-stage hinged foldable sealing plate according to an embodiment of the present disclosure.

FIG. 6 illustrates a graphic diagram perspective view of a reconfigurable cooling fan holder 600 with a two-stage hinged foldable sealing plate 617 according to an embodiment of the present disclosure. In the embodiment of FIG. 6, a reconfigurable cooling fan holder 600 includes a plurality of sliding bars 602, 603, 604, 605, 606 and 608 to form a reconfigurable frame of the reconfigurable fan holder 600. The sliding bars 602, 603, 604, 605, 606 and 608 form slidably adjustable length and width walls of the reconfigurable cooling fan holder 600 and adjust as to length and width by sliding nestingly to extend or reduce the length of the adjustable frame or extend or reduce the width of the adjustable frame. The position of the adjustable length or width of the reconfigurable cooling fan holder 600 may be then set via set screws such as set screws 610 or other setting fasteners holding sliding bar 608 with respect to sliding bars 602 and 604 in the shown embodiment.

The reconfigurable cooling fan holder 600 includes at least one two-stage hinged foldable sealing plate 617 with hinges 618. The two-stage, hinged, foldable sealing plate 617 is foldable to the left-side or right-side slidably adjustable length side wall of the reconfigurable cooling fan holder 600 in an embodiment. In the shown embodiment, a pair of two-stage hinged foldable sealing plates 617 are shown on both slidably adjustable length side walls of the reconfigurable cooling fan holder 600.

FIG. 6 further shows three cooling fans 601 mounted on adjustable position resiliency screws 630 with fastener 644 to sliding bars 602 and 604 of the left-side and right-side slidably adjustable length side walls of the reconfigurable cooling fan holder 600 in an embodiment. In the shown embodiment, a bank of three cooling fans 601 are shown and they are of a narrower dimension as described in further embodiments herein. Thus, the reconfigurable cooling fan holder 600 is set to a narrower configuration which may require either or both stages of the shown two-stage foldable sealing plates 617 to be opened or extended to fit a vent aperture for an information handling system in which the bank of cooling fans 601 may be installed in various embodiments. In this way, the reconfigurable cooling fan holder 600 with two-stage hinged, foldable sealing plates 617 may have even greater adjustability for use with various vent aperture sizes in information handling systems to provide additional reconfigurability to a user according to the embodiments herein. While two-stage hinged foldable sealing plates 617 are shown in FIG. 6, it is contemplated that a multi-stage hinged foldable sealing plate of any number of stages may be used with the reconfigurable cooling fan holder 600 of embodiments herein.

Figure 7A:
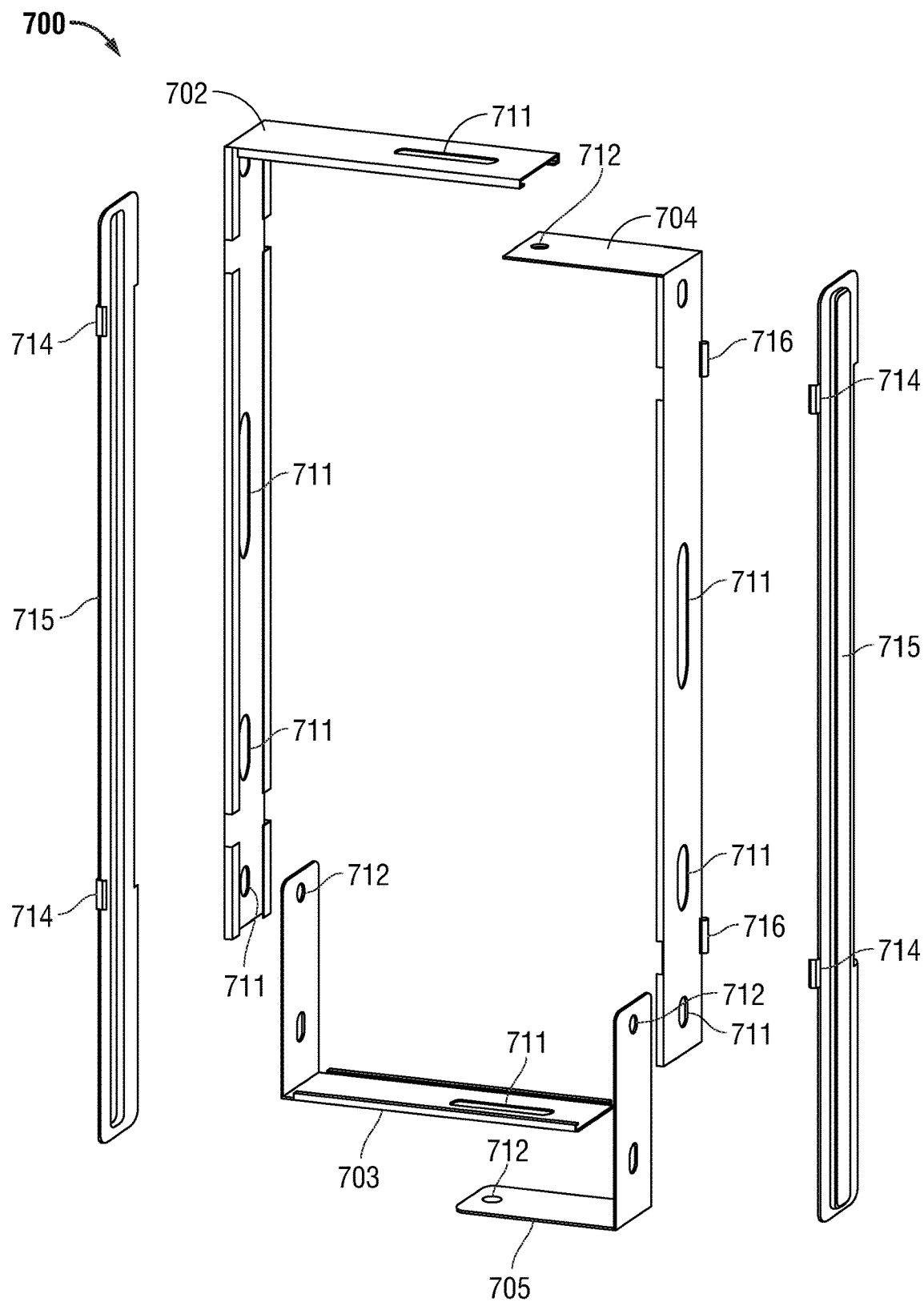
FIG. 7A is an exploded graphic diagram of a reconfigurable cooling fan holder with a second example length reconfigurability according to another embodiment of the present disclosure.

FIG. 7A is a graphic diagram that illustrates an exploded perspective view of a reconfigurable cooling fan holder 700 according to another embodiment of the present disclosure. The reconfigurable cooling fan holder 700 is shown to include an embodiment where fewer sliding bars are required to assemble the reconfigurable frame of the reconfigurable cooling fan holder 700 than compared to embodiments above. In particular, sliding bars 702, 703, 704, and 705 comprise both the left-side and right-side slidably adjustable length sidewalls and the top and bottom slidably adjustable width sidewalls for the reconfigurable frame of the reconfigurable cooling fan holder 700. In the shown embodiment, sliding bar 703 is nested with and disposed adjacent to sliding bar 702 to form a left-side slidably adjustable length sidewall. Similarly, sliding bar 705 is nested with and disposed adjacent to sliding bar 704 to form a right-side slidably adjustable length sidewall in an embodiment. Additionally, sliding bar 704 is nested with and disposed adjacent to sliding bar 702 to form a top-side slidably adjustable width sidewall in an embodiment. Further, sliding bar 705 is nested with and disposed adjacent to sliding bar 703 to form a bottom-side slidably adjustable width sidewall in an embodiment. Set screws or other setting fasteners (not shown) may be used and installed in elongated apertures 711 in the slide bars to set the length or width the sliding bars 702, 703, 704, and 705 with respect to one another. The set screws or other setting fasteners may further be installed in a receiver aperture 712 formed into the paired sliding bar such that the elongated apertures 711 of a first slide bar may be slidingly adjusted relative to the receiver aperture 712 of the nested slide bar pair to set the length and width of the reconfigurable frame for the reconfigurable cooling fan holder 700 according to embodiments herein. In an additional aspect, the reconfigurable cooling fan holder 700 may include a hinged foldable sealing plate 715 operatively coupled to the left-side or right-side slidingly adjustable length sidewall in an embodiment. For example, the hinged foldable sealing plates 715 are operatively coupled to slide bars 702 and 704 in an embodiment. The hinged foldable sealing plates 715 are operably coupled to the slide bars 702 and 704 via a hinge 716 on those slide bars. In another embodiment, a latch extension 714 on the hinged foldable sealing plates 715 may be used to hold the hinged foldable sealing plates 715 in a closed position in a notch in the slide bars 702 and 704 respectively when closed. Although the example embodiment of FIG. 7A shows slide bars 704 and 703 having extension portions that nest under slide bar 702 and slide bar 705 has extension portions that nest under slide bars 703 and 704, it is contemplated that the order or orientation of the slide bars as to nesting into sliding slots or sliding tracks may be in any order or orientation according to various embodiments. For example, slide bar 702 could slidingly nest inside either or both of slide bars 703 and 704, for example in a sliding track, in some embodiments. Similarly, either or both of slide bars 703 and 704 may slidingly nest inside slide bar 705 in other embodiments.

Figure 7B:
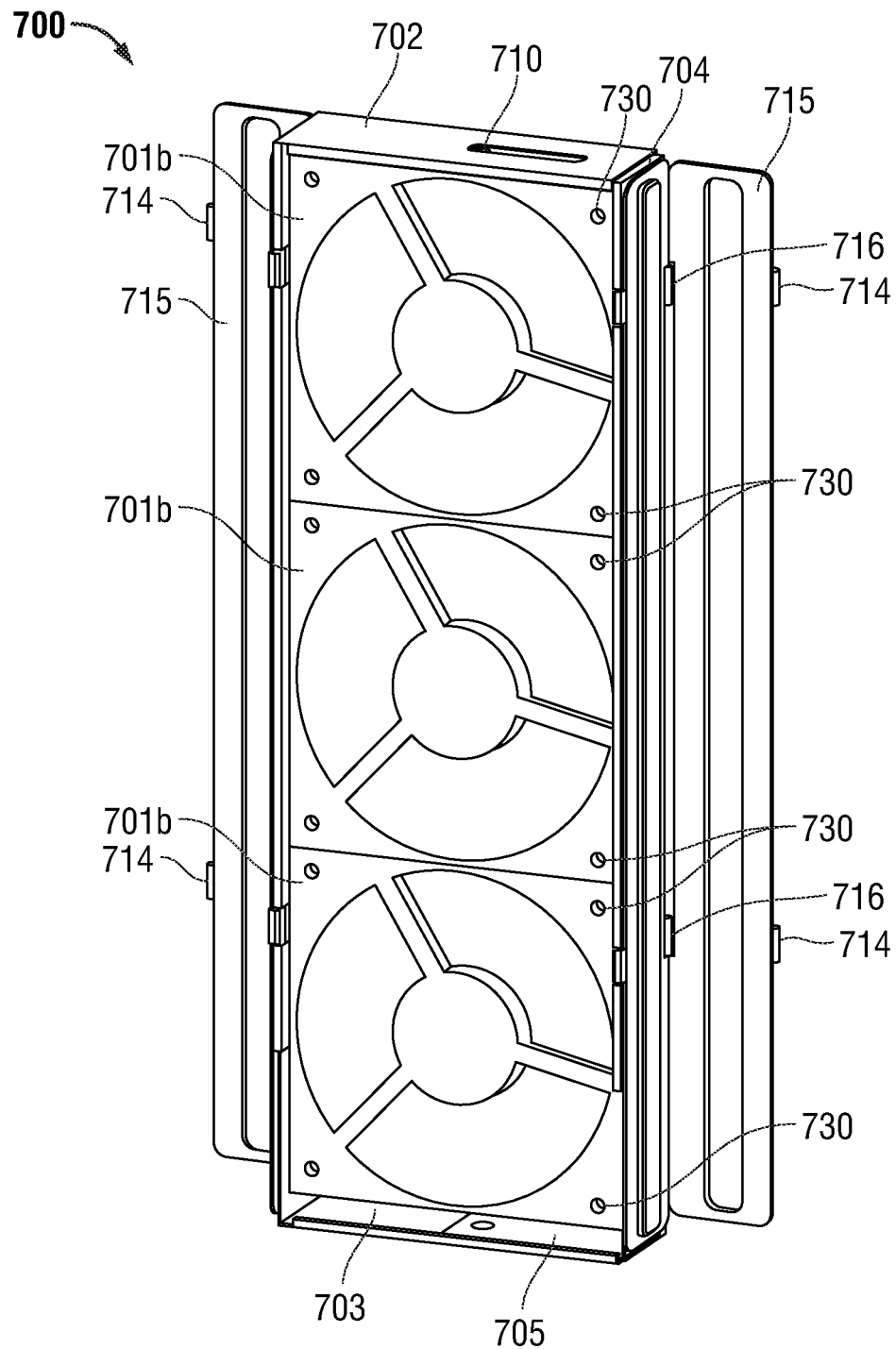
FIG. 7B is a graphic diagram of a reconfigurable cooling fan holder with a second example length reconfigurability accommodating a first fan type in a first configuration according to another embodiment of the present disclosure.

FIG. 7B is graphic diagram that illustrates a perspective view of a reconfigurable cooling fan holder 700 according to an embodiment of the present disclosure. The reconfigurable cooling fan holder 700 is shown in a configuration for accommodating a narrow type of cooling fan 701b having a narrower width dimension than an alternative cooling fan option usable with the reconfigurable cooling fan holder 700. In the shown embodiment, a bank of three cooling fans 701b are shown mounted in the reconfigurable cooling fan holder 700 via a plurality of adjustable position resiliency screws 730. The reconfigurable cooling fan holder 700 includes the plurality of slide bars 702, 703, 704 and 705 forming the four sidewalls of the reconfigurable cooling fan holder 700 according to the embodiment. The top slidingly adjustable width sidewall is shown comprised of slide bar 704 nested inside slide bar 702 and set with a fastener 710 such as a set screw.

The embodiment of FIG. 7B also shows the reconfigurable cooling fan holder 700 may include hinged foldable sealing plates 715 in an open position and operatively coupled to the left-side or right-side slidingly adjustable length sidewall in an embodiment. For example, the hinged foldable sealing plates 715 are operatively coupled to slide bars 702 and 704 in the shown embodiment via hinges 716. Further, in another embodiment, a latch extension 714 on the hinged foldable sealing plates 715 may be used to hold the hinged foldable sealing plates 715 in a closed position in a notch in the slide bars 702 and 704 respectively when closed. Although the example embodiment of FIG. 7B shows slide bars 704 and 703 having extensions that nest under slide bar 702, and slide bar 705 nests under slide bars 703 and 704, it is contemplated that the order or orientation of the slide bars as to nesting into sliding slots or tracks may be in any order or orientation according to various embodiments as described.

Figure 7C:
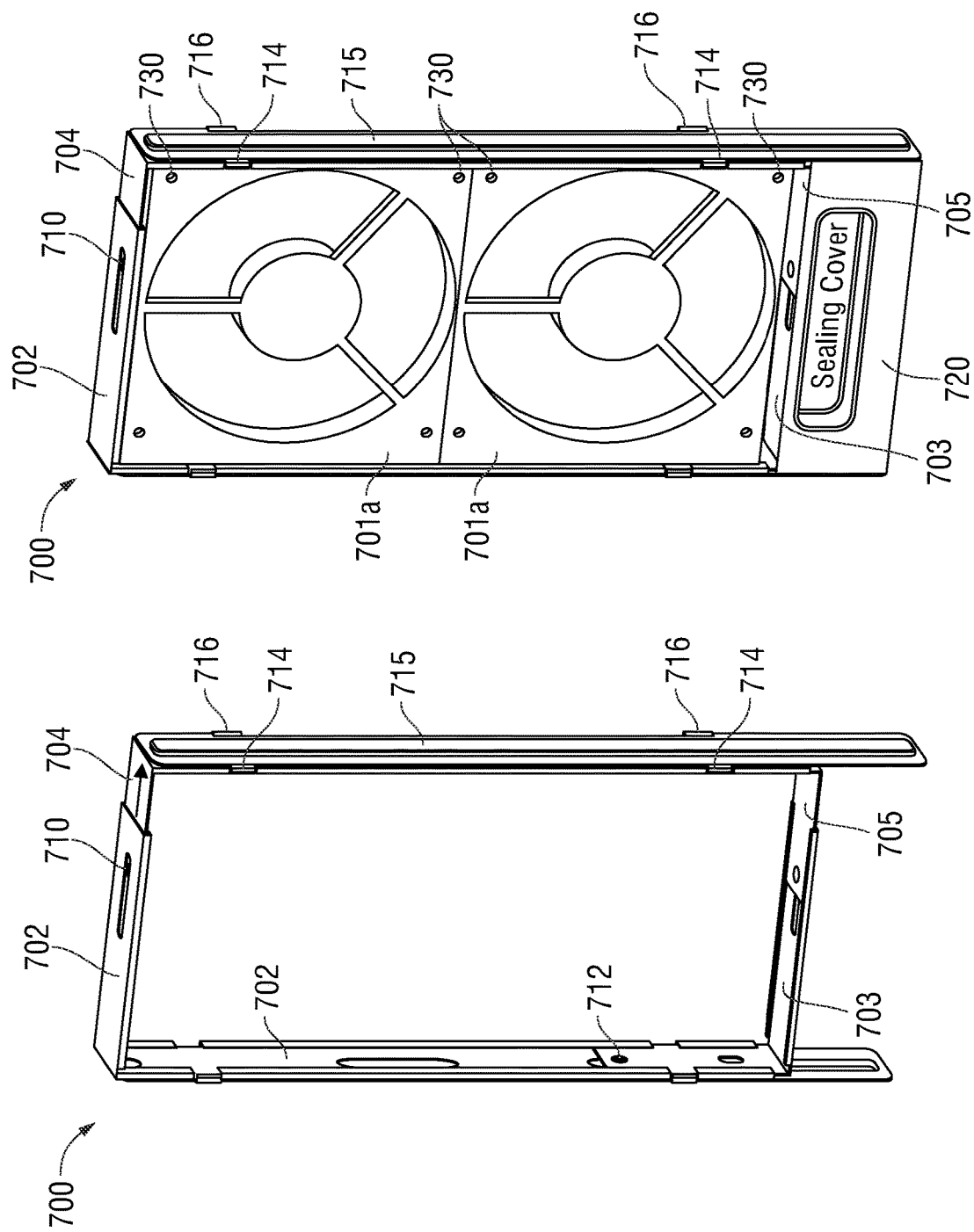
FIG. 7C is a graphic diagram of a reconfigurable cooling fan holder with a second example length configuration accommodating a second fan type with and without the second fan type mounted according to another embodiment of the present disclosure.

FIG. 7C is graphic diagram that illustrates a perspective view of a reconfigurable cooling fan holder 700 with and without cooling fans mounted therein according to an embodiment of the present disclosure. In particular, the reconfigurable cooling fan holder 700 is shown with and without cooling fans 701*a* that is a wider cooling fan type than cooling fan 701*b* of FIG. 7B. In FIG. 7C, the reconfigurable cooling fan holder 700 is in a configuration for accommodating a wider type of cooling fan 701*a* having a wider width dimension. In the shown embodiment, a bank of two cooling fans 701*a* are shown in the left image mounted in the reconfigurable cooling fan holder 700 via a plurality of adjustable position resiliency screws 730. The reconfigurable cooling fan holder 700 includes the plurality of slide bars 702, 703, 704 and 705 forming the four sidewalls of the reconfigurable cooling fan holder 700 according to the embodiment. The left-side slidingly adjustable length sidewall is shown comprised of slide bar 703 nested inside of slide bar 702 and set with a retaining or setting fastener or set screw installed in the receiver aperture 712 to set the length of the reconfigurable cooling fan holder in an embodiment. Similarly, the right-side slidingly adjustable length sidewall is shown comprised of slide bar 705 nested inside of slide bar 704 and set with a retaining or setting fastener or set screw to set the length of the reconfigurable cooling fan holder.

The top slidingly adjustable width sidewall is shown comprised of slide bar 704 nested inside slide bar 702 and set with a fastener 710 such as a set screw and in the right image shown as extended as to width for the reconfigurable cooling fan holder 700. The bottom slidingly adjustable width sidewall is shown comprised of slide bar 705 nested inside slide bar 703 as well. In the embodiment of FIG. 7C with the wider cooling fan type 701*b* mounted in the reconfigurable cooling fan holder 700, a potential gap in a vent aperture of an information handling system is filled with the insertable sealing cover 720 and shown in the image with the mounted cooling fans 701*b*.

The reconfigurable cooling fan holder 700 may include the hinged foldable sealing plates 715 in a closed position for the configuration shown in the embodiment of FIG. 7C to accommodate the wider cooling fan type 701*a*. The hinged foldable sealing plates 715 are operatively coupled to the slidingly adjustable left-side or right-side length sidewall in an embodiment. For example, the hinged foldable sealing plates 715 are operatively coupled to slide bars 702 and 704 in the shown embodiment via hinges 716. Further, in another embodiment, a latch extension 714 on the hinged foldable sealing plates 715 holds the hinged foldable sealing plates 715 in a closed position in a notch in the slide bars 702 and 704 respectively as shown. Although the example embodiment of FIG. 7B shows slide bars 704 and 703 having extensions that nest under slide bar 702 and slide bar 705 nests under slide bars 703 and 704, it is contemplated that the order or orientation of the slide bars as to nesting into sliding slots or tracks may be in any order or orientation according to various embodiments as described.

Figure 8:
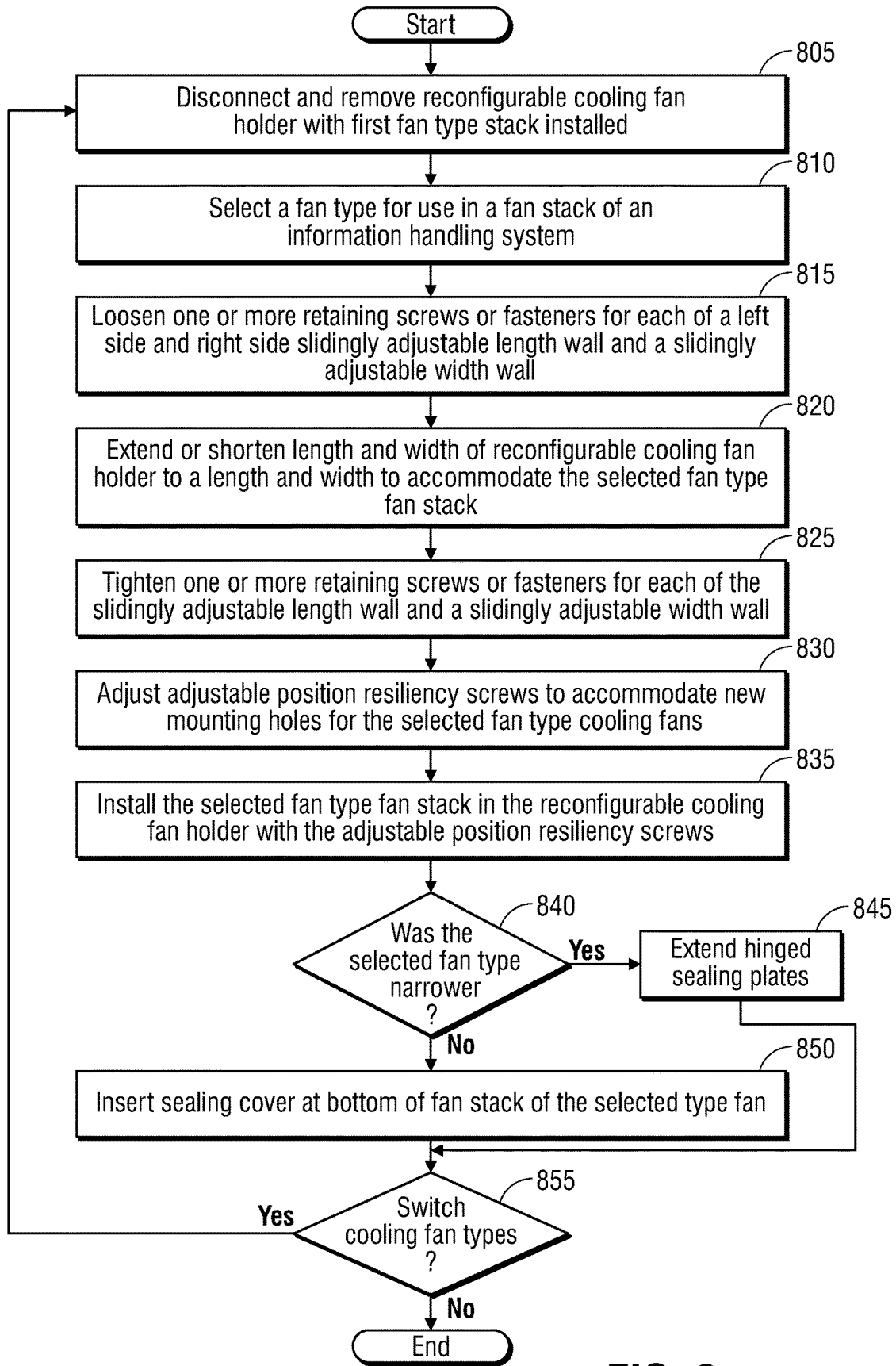
FIG. 8 is a flow diagram illustrating a method of adjusting and installing a reconfigurable cooling fan holder with a cooling fan according to an embodiment of the present disclosure.

FIG. 8 is a flow diagram illustrating a method installing a reconfigurable cooling fan holder and adjusting the configuration of a reconfigurable cooling fan holder to accommodate plural active cooling systems for an information handling system such as a desktop information handling system or a server information handling system according to an embodiment of the present disclosure. A manufacturer may install a reconfigurable cooling fan holder to accommodate any of a number of active cooling fans in a bank of cooling fans when assembling an information handling system. In some embodiments, a user may select to replace active cooling systems when customizing their information handling system in order to utilize cooling fans of different sizes to maximize or otherwise alter cooling airflow to enhance performance of the information handling system or save power. Installing or replacing a bank of cooling fans may require differing sizes of cooling fan to be used. The reconfigurable cooling fan holder of embodiments herein provides for a capability of adding or switching among cooling fans of different sizes without having to purchase or use an additional cooling fan holders and further provides for a flexible mounting system for different sized cooling fans and banks of cooling fans allowing an installer to modify cooling systems used.

The method may begin at block 805 in an embodiment where a user chooses modify the cooling fans utilized with their information handling system. In such a case, the existing cooling fans must be disconnected and the reconfigurable cooling fan holder removed. In the case of a manufacturer assembling a block of cooling fans in an information handling system, block 805 may already have disconnected cooling fans and the reconfigurable cooling fan holder may not be installed yet. With the information handling system turned off and the chassis opened, the user or manufacturer disconnects any cooling fans and removes any already installed reconfigurable cooling fan holder.

At block 810, a fan type is selected for use with the reconfigurable cooling fan holder so the reconfigurable cooling fan holder configuration may be adjusted to accommodate the dimensions of the selected fan type and a bank of the selected fans in a fan stack in an embodiment. In an example embodiment, selection may be made between a bank of wider cooling fans or a bank of narrower cooling fans relative to one another that may fit within a vent aperture of the information handling system in various fan stacks. The narrower cooling fans may provide for a greater number of cooling fans that may fit in the vent aperture thus providing a greater amount of active cooling airflow via the cooling vent aperture, but which may utilize greater power consumption or generate greater noise in some embodiments than fewer but wider cooling fans.

Proceeding to block 815, the reconfigurable cooling fan holder comprises and adjustable frame having four slidably adjustable walls according to embodiments herein. In some embodiments only three slidably adjustable walls are used, and a fourth side may support the bottom or top fan but may not be slidingly adjustable. In one embodiment, two slidingly adjustable walls are slidably adjustable length walls to increase or decrease the length of the reconfigurable cooling fan holder, namely a left-side slidably adjustable length wall and a right-side slidably adjustable length wall depending on the side of the reconfigurable cooling fan holder that is being viewed. Up to two slidingly adjustable walls are slidably adjustable width walls, namely a top slidably adjustable width wall and an optional bottom slidably adjustable width wall that may be adjusted to increase or decrease the width of the reconfigurable cooling fan holder according to embodiments herein. Each of the slidably adjustable walls of the adjustable frame for the reconfigurable cooling fan holder comprise at least two slide bars nestingly slidable with respect to one another and nested adjacent to one another. In one embodiment, two slide bars are nested adjacent to one another to form the slidably adjustable wall such as the lengthwise slidably adjustable walls of the embodiments FIGS. 3A and 3B or all the slidably adjustable walls of the embodiments of FIGS. 7A, 7B, and 7C. In another embodiment, three slide bars are nested adjacent to one another to form a slidably adjustable wall such as the widthwise slidably adjustable walls of the embodiments FIGS. 3A and 3B. Any of the four slidably adjustable walls of the reconfigurable cooling fan holder may be two slide bars, three slide bars, or another number of nested slide bars. The sliding adjustability of the slide bars is fixed at a given length or width dimension via one or more retaining screws or retaining or setting fasteners between two or more overlapping slide bars nested adjacent to one another according to various embodiments described herein. If an adjustment to the length or width of the reconfigurable cooling fan holder is required to accommodate the selected fan type from block 815, the retaining screws or retaining fasteners for each of the four slidably adjustable walls must be loosened to permit the nested slide bars comprising each slidably adjustable side wall to slide with respect to each other for both length and width adjustments.

At block 820, the adjustable frame of the reconfigurable cooling fan holder may be adjusted with respect to length and width to accommodate the dimension of the selected fan type and to fit a plurality of cooling fans of the selected fan type into a bank of cooling fans operatively coupled to the reconfigurable cooling fan holder according to embodiments herein.

To extend or reduce the length of the reconfigurable cooling fan holder, each of the left-side and right-side slidingly adjustable length walls may be adjusted by sliding a first slide bar with respect to the nested and adjacent second slide bar forming each slidingly adjustable length wall to either extend that slidingly adjustable length wall or reduce the length of that slidingly adjustable length wall. As shown in the embodiments herein, each of the plural slide bars that comprise each of the left-side and right-side slidingly adjustable length wall may be pulled apart such that the inner nested slide bar is partly pulled out from the track of the outer nested slide bar to extend the slidingly adjustable length wall. In another embodiment, each of the plural slide bars that comprise each of the left-side and right-side slidingly adjustable length wall may be pushed together such that the inner nested slide bar is further slid into the track of the outer nested slide bar to overlap the two slide bars and reduce the length of the lengthwise slidingly adjustable wall. In embodiments herein, slidingly adjustable length walls and lengthwise slidingly adjustable walls are terms used interchangeably.

Similarly, to extend or reduce the width of the reconfigurable cooling fan holder, a top slidingly adjustable width wall, and in some optional embodiments a bottom slidingly adjustable width wall may be adjusted by sliding a first slide bar with respect to the nested and adjacent second slide bar forming the top slidingly adjustable width wall, and optionally the bottom slidingly adjustable width wall to either extend that slidingly adjustable width wall or reduce the width of that widthwise slidingly adjustable wall. In embodiments herein, slidingly adjustable width walls and widthwise slidingly adjustable walls are terms used interchangeably. In some embodiments herein, a bottom slidingly adjustable width wall is used to hold the bank of cooling fans having two or more slide bars. In other embodiments, only extensions of one of the side slide bars from bottom corners and a retaining fin are used to hold a bottom cooling fan in the reconfigurable cooling fan holder. As shown in the various embodiments herein, each of the plural slide bars that comprise each of the top, and optionally bottom, slidingly adjustable width wall may be pulled apart such that at least one inner nested slide bar or optionally two inner nested slide bars are partly pulled out from the track of the outer nested slide bar to extend the widthwise slidingly adjustable wall. In another embodiment, each of the plural slide bars that comprise each of the top, and optionally bottom slide bars of the widthwise slidingly adjustable wall may be pushed together such that at least one inner nested slide bar or both inner slide bars are further slid into the track of the outer nested slide bar to overlap the plural slide bars to a greater extent and reduce the width of the widthwise slidingly adjustable wall. It is understood that in the embodiment of configurations shown in FIGS. 3A and 3B, the slidingly adjustable width walls are comprised of three nested slide bars: the top corner extensions of slide bars 302 and 304 and the top slide bar 308. In another embodiment herein shown in FIG. 7A, FIG. 7B and FIG. 7C, the slidingly adjustable width walls are comprised of two nested slide bars: the top corner extensions of slide bars 702 and 704. Further, the optional embodiment is shown including the bottom slidingly adjustable width walls comprised of slide bar 703 and 705. The slidingly adjustable width walls may be comprised of any number of plural slide bars according to embodiments herein.

Proceeding to block 825, the retaining screws or retaining or setting fasteners for each of the four slidably adjustable walls must be tightened to set the width and length by fixing the nested slide bars comprising each slidably adjustable side walls in place so they no longer slide with respect to each other. The sliding adjustability of the slide bars is fixed at a given length or width dimension via tightening the one or more retaining screws or retaining or setting fasteners between two or more overlapping slide bars nested adjacent to one another according to various embodiments described herein.

At block 830, a plurality of adjustable position resiliency screws may be installed in the reconfigurable cooling fan holder along the slidingly adjustable length walls or optionally in part along the slidingly adjustable width walls in an embodiment. The screw post of the adjustable position resiliency screws are installed into a slide bar in the slidingly adjustable length walls or optionally in part along the slidingly adjustable width walls in a receiver aperture and fixed to the slide bar with a retaining fastener such as a nut as well as a rubber cushion in the slide bar to move within the slide bar up or down. Further, the depth at which the screw post of the adjustable position resiliency screw is inserted into the receiver fastener or nut determines the position of the mounting post away from the slide bar or, in other words, the length of the adjustable position resiliency screw to align with the mounting aperture on the housing of the cooling fan. The dimension or distance of the corner mounting aperture on the housing of the cooling fan may vary among cooling fan and the length of the adjustable position resiliency screw in the slide bar of the reconfigurable cooling fan holder is sized to align with the selected fan type. This sizing and alignment of the adjustable position resiliency screw in the slidingly adjustable length walls of the reconfigurable cooling fan holder may be done for a plurality of adjustable position resiliency screws in some embodiments. For example, four adjustable position resiliency screws for each cooling fan in the fan stack or fan bank are used to mount the selected cooling fan type in the reconfigurable cooling fan holder in an embodiment. In some embodiments, the bottom cooling fan in a fan stack may only be mounted with two adjustable position resiliency screws and the bottom held with one or more fan holder fins.

Turning to block 835, the cooling fan is mounted by disposing the mounting post and dampening cushion portion of the adjustable position resiliency screw in a slot in the corner of the housing of the cooling fan. Then the mounting post may be press fit into the corner mounting aperture disposed in the face of the cooling fan housing in an embodiment. In this way, the mounting post and dampening cushion of the adjustable position resiliency screw may dampen vibration and thus noise of the fan stack during operation of the selected cooling fans.

Proceeding to block 840, it is determined whether the selected fan type used in the fan stack is a narrower type of cooling fan in an embodiment. If so, gaps on the sides of the reconfigurable cooling fan holder when installed at the vent aperture of the information handling system may cause recirculation of air reducing cooling fan efficiency. If the selected fan is a narrow cooling fan type to accommodate a greater number of cooling fans in the fan stack, the flow proceeds to block 845. If the selected fan is not a narrow type cooling fan, a gap at the bottom of the cooling fan stack installed at the vent aperture may cause recirculation of air which may also reduce cooling fan efficiency. In this latter case, the flow may proceed to block 850.

At block 845, when it is determined that a narrow type cooling fan has been selected for use with the reconfigurable cooling fan holder, the reconfigurable cooling fan holder may come equipped with foldable, hinged sealing plates which may be single stage sealing plates or multi-stage sealing plates. In an embodiment, the installer may extend or open one or more of the foldable, hinged sealing plates to a size to fill any gaps in the sides of the reconfigurable cooling fan holder and the edge of the vent aperture of the information handling system. At this point, the reconfigurable cooling fan holder with the fan stack having the selected, narrower type cooling fans may be installed at the vent aperture of the information handling system. It is noted that the vent aperture of the information handling system may be wider than the narrow cooling fan type to accommodate the optional use of wider cooling fan types. Then the flow may proceed to block 855.

Returning to block 850 when it is determined that the selected type of cooling fan for use with the reconfigurable cooling fan holder is not a narrow fan, but instead is a wider cooling fan type relative to the narrower cooling fan type, the reconfigurable cooling fan holder may come equipped with an insertable sealing cover. In an embodiment, the installer may insert the insertable sealing cover below or above the fan stack of the wider selected cooling fans. The insertable sealing cover is sized to fill any gaps in the top or bottom of the fan stack in the reconfigurable cooling fan holder as compared to the vent aperture of the information handling system that is designed larger to accommodate a greater number of fans in a fan stack when a different cooling fan type is used. At this point, the reconfigurable cooling fan holder with the fan stack having the selected, wide type cooling fans may be installed at the vent aperture of the information handling system. The vent aperture of the information handling system may be longer than the fan stack of wider cooling fans to accommodate optional use of more cooling fans in a fan stack. Then the flow may proceed to block 855.

At block 855 if there is no need to switch cooling fan types, then the method may end. If there is a decision at some point to reconfigure the thermal cooling system and replace the cooling fans used with the reconfigurable cooling fan holder, then flow may return to block 805 and selection and installation of a new cooling fan type may be conducted as described in FIG. 8 herein.

The blocks of the flow diagrams of FIG. 8 or steps and aspects of the operation of the embodiments herein and discussed herein need not be performed in any given or specified order. It is contemplated that additional blocks, steps, or functions may be added, some blocks, steps or functions may not be performed, blocks, steps, or functions may occur contemporaneously, and blocks, steps, or functions from one flow diagram may be performed within another flow diagram.

Devices, modules, resources, or programs that are in communication with one another need not be in continuous communication with each other, unless expressly specified otherwise. In addition, devices, modules, resources, or programs that are in communication with one another may communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The subject matter described herein is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents and shall not be restricted or limited by the foregoing detailed description.

What is claimed is:

1. An information handling system with a cooling system, comprising:
   a processor;
   a memory;
   a power management unit (PMU) operatively coupled to the processor;
   a plurality of cooling fans in a fan stack operatively coupled to a reconfigurable cooling fan holder mounted at a vent aperture of the information handling system to draw air into or direct air out of a chassis of the information handling system;
   the reconfigurable cooling fan holder including a reconfigurable frame having a plurality of slidingly adjustable walls;
   each slidingly adjustable wall includes at least two slide bars nested adjacent to one another, where the reconfigurable cooling fan holder may be expanded or reduced in length by sliding the at least two slide bars nested adjacent to one another forming a lengthwise slidingly adjustable wall to extend or contract the lengthwise slidingly adjustable wall from the plurality of slidingly adjustable walls and where the reconfigurable cooling fan holder may be expanded or reduced in width by sliding the at least two slide bars nested adjacent to one another forming a widthwise slidingly adjustable wall to extend or contract the widthwise slidingly adjustable wall from the plurality of slidingly adjustable walls;
   a first setting fastener disposed into the at least two slide bars nested adjacent to one another forming the lengthwise slidingly adjustable wall to set the length of the reconfigurable cooling fan holder;
   a second setting fastener disposed into the at least two slide bars nested adjacent to one another forming the widthwise slidingly adjustable wall to set the width of the reconfigurable cooling fan holder; and a hinged, foldable sealing plate operatively coupled to the lengthwise slidingly adjustable wall via a hinge to be opened when the plurality of cooling fans mounted in the reconfigurable cooling fan holder are narrow fans, the hinged, foldable sealing plate to fill a gap between the reconfigurable cooling fan holder and an edge of the vent aperture of the information handling system.

2. The information handling system of claim 1, wherein the widthwise slidingly adjustable wall is a top widthwise slidingly adjustable wall and the reconfigurable frame of the reconfigurable cooling fan holder includes a bottom widthwise slidingly adjustable wall of the plurality of slidingly adjustable walls.

3. The information handling system of claim 1, further comprising:
a second lengthwise slidingly adjustable wall to set the length of the reconfigurable cooling fan holder.

4. The information handling system of claim 1, further comprising:
a plurality of adjustable position resiliency screws with a mounting post operably coupled to the lengthwise slidingly adjustable wall of the reconfigurable cooling fan holder; and
the mounting posts of the plurality of adjustable position resiliency screws press fit to a plurality of mounting apertures of the plurality of cooling fans to mount the plurality of cooling fans to the reconfigurable cooling fan holder.

5. The information handling system of claim 4, further comprising:
the plurality of adjustable position resiliency screws including the mounting post and a vibration cushion formed of a material to absorb vibrations during the operation of the plurality of cooling fans.

6. The information handling system of claim 1, further comprising:
a pair of hinged, foldable sealing plates operatively coupled to the pair of lengthwise slidingly adjustable walls via plural hinges to be opened when the plurality of cooling fans mounted in the reconfigurable cooling fan holder are narrow fans to fill the gap between the reconfigurable cooling fan holder and the edge of the vent aperture of the information handling system.

7. The information handling system of claim 1, further comprising:
the hinged, foldable sealing plate operatively coupled to the lengthwise slidingly adjustable wall via the hinge to be folded when the plurality of cooling fans mounted in the reconfigurable cooling fan holder are wide fans with a dimension as wide as the vent aperture.

8. The information handling system of claim 1, further comprising: an insertable sealing cover inserted below the plurality of cooling fans to fill a second gap between a fan stack of the plurality of cooling fans and a second edge of the vent aperture of the information handling system.

9. An information handling system with a cooling system, comprising:
a processor;
a memory;
a power management unit (PMU) operatively coupled to the processor;
a plurality of cooling fans in a fan stack operatively coupled to a reconfigurable cooling fan holder mounted at a vent aperture of the information handling system to draw air into or direct air out of a chassis of the information handling system;
the reconfigurable cooling fan holder including a reconfigurable frame having a plurality of slidingly adjustable walls;
a pair of lengthwise slidingly adjustable walls of the plurality of slidingly adjustable walls includes at least two slide bars nested adjacent to one another, where the reconfigurable cooling fan holder may be expanded or reduced in length by sliding the at least two slide bars nested adjacent to one another forming the lengthwise slidingly adjustable wall to extend or contract the lengthwise slidingly adjustable wall;
a widthwise slidingly adjustable wall of the plurality of slidingly adjustable walls includes at least two slide bars nested adjacent to one another, where the reconfigurable cooling fan holder may be expanded or reduced in width by sliding the at least two slide bars nested adjacent to one another forming the widthwise slidingly adjustable wall to extend or contract the widthwise slidingly adjustable wall; and
a plurality of setting fasteners to set the length of the pair of lengthwise slidingly adjustable walls and to set the width of the widthwise slidingly adjustable wall to set the length and width of the reconfigurable cooling fan holder; and
a hinged, foldable sealing plate operatively coupled to the lengthwise slidingly adjustable wall via a hinge to be opened when the plurality of cooling fans mounted in the reconfigurable cooling fan holder are narrow fans, the hinged, foldable sealing plate to fill a gap between the reconfigurable cooling fan holder and an edge of the vent aperture of the information handling system.

10. The information handling system of claim 9, wherein the reconfigurable frame of the reconfigurable cooling fan holder includes a second widthwise slidingly adjustable wall of the plurality of slidingly adjustable walls.

11. The information handling system of claim 9, further comprising:
a plurality of adjustable position resiliency screws with a mounting post operably coupled to the lengthwise slidingly adjustable wall of the reconfigurable cooling fan holder; and
the mounting posts of the plurality of adjustable position resiliency screws press fit to a plurality of mounting apertures of the plurality of cooling fans to mount the plurality of cooling fans to the reconfigurable cooling fan holder.

12. The information handling system of claim 11, further comprising:
the plurality of adjustable position resiliency screws including the mounting post and a vibration cushion formed of a material to absorb vibrations during the operation of the plurality of cooling fans.

13. The information handling system of claim 9, further comprising:
a pair of hinged, foldable sealing plates operatively coupled to the pair of lengthwise slidingly adjustable walls via plural hinges to be opened when the plurality of cooling fans mounted in the reconfigurable cooling fan holder are narrow fans to fill the gap between the reconfigurable cooling fan holder and the edge of the vent aperture of the information handling system.

14. The information handling system of claim 9, further comprising:
a pair of two-stage, hinged, foldable sealing plates operatively coupled to the pair of lengthwise slidingly adjustable walls via plural hinges to be opened when the plurality of cooling fans mounted in the reconfigurable cooling fan holder are narrow fans, the pair of hinged, foldable sealing plates to fill the gap between the reconfigurable cooling fan holder and the edge of the vent aperture of the information handling system.

15. The information handling system of claim 9, wherein the widthwise slidingly adjustable wall of the plurality of slidingly adjustable walls includes at least three slide bars nested adjacent to one another, where the reconfigurable cooling fan holder may be expanded or reduced in width by sliding at least two slide bars nested adjacent to the third slide bar forming the widthwise slidingly adjustable wall to extend or contract the widthwise slidingly adjustable wall.

16. A reconfigurable cooling fan holder for a cooling system of an information handling system, comprising:
   a plurality of cooling fans in a fan stack of the cooling system operatively coupled to a reconfigurable frame and mounted at a vent aperture of the information handling system to draw air into or direct air out of a chassis of the information handling system;
   the reconfigurable frame having a plurality of slidingly adjustable walls including a pair of lengthwise slidingly adjustable walls and a widthwise slidingly adjustable wall;
   the pair of lengthwise slidingly adjustable walls includes at least two slide bars nested adjacent to one another, where the reconfigurable frame may be expanded or reduced in length by sliding the at least two slide bars forming each lengthwise slidingly adjustable wall and nested adjacent to one another to extend or contract each lengthwise slidingly adjustable wall;
   the widthwise slidingly adjustable wall includes at least two slide bars nested adjacent to one another, where the reconfigurable frame may be expanded or reduced in width by sliding the at least two slide bars forming the widthwise slidingly adjustable wall and nested adjacent to one another to extend or contract the widthwise slidingly adjustable wall;
   a plurality of setting fasteners to set the length of the pair of lengthwise slidingly adjustable walls and to set the width of the widthwise slidingly adjustable wall to set the length and width of the reconfigurable frame; and
   a hinged, foldable sealing plate operatively coupled operatively coupled to the pair of lengthwise slidingly adjustable walls via a hinge to be opened when the plurality of cooling fans mounted in the reconfigurable cooling fan holder are narrow fans, the pair of hinged, foldable sealing plates to fill a gap between the reconfigurable cooling fan holder and an edge of the vent aperture of the information handling system.

17. The reconfigurable cooling fan holder of claim 16, further comprising:
   a plurality of adjustable position resiliency screws with a mounting post operably coupled to the lengthwise slidingly adjustable wall of the reconfigurable frame; and
   the mounting posts of the plurality of adjustable position resiliency screws press fit to a plurality of mounting apertures of the plurality of cooling fans to mount the plurality of cooling fans to the reconfigurable cooling fan holder.

18. The reconfigurable cooling fan holder of claim 16, further comprising: an insertable sealing cover inserted below the plurality of cooling fans to fill a second gap between a fan stack of the plurality of cooling fans and a second edge of the vent aperture of the information handling system.

19. The reconfigurable cooling fan holder of claim 16, further comprising:
   a pair of two-stage, hinged, foldable sealing plates operatively coupled to the pair of lengthwise slidingly adjustable walls via plural hinges to be opened when the plurality of cooling fans mounted in the reconfigurable cooling fan holder are narrow fans, the pair of two-stage, hinged, foldable sealing plates to fill the gap between the reconfigurable cooling fan holder and the edge of the vent aperture of the information handling system.

20. The reconfigurable cooling fan holder of claim 16, wherein the widthwise slidingly adjustable wall of the plurality of slidingly adjustable walls includes at least three slide bars nested adjacent to one another, where the reconfigurable frame may be expanded or reduced in width by sliding at least two slide bars nested adjacent to the third slide bar forming the widthwise slidingly adjustable wall to extend or contract the widthwise slidingly adjustable wall.

\* \* \* \* \*